US009253902B2

(12) United States Patent
Tsuchida et al.

(10) Patent No.: US 9,253,902 B2
(45) Date of Patent: Feb. 2, 2016

(54) ELECTRONIC DEVICE

(71) Applicant: SONY COMPUTER ENTERTAINMENT INC., Tokyo (JP)

(72) Inventors: Shinya Tsuchida, Tokyo (JP); Yuta Tamaki, Chiba (JP)

(73) Assignees: SONY CORPORATION, Tokyo (JP); SONY COMPUTER ENTERTAINMENT INC., Tokyo (JP)

( * ) Notice: Subject to any disclaimer, the term of this patent is extended or adjusted under 35 U.S.C. 154(b) by 140 days.

(21) Appl. No.: 13/861,457

(22) Filed: Apr. 12, 2013

(65) Prior Publication Data

US 2013/0269969 A1 Oct. 17, 2013

(30) Foreign Application Priority Data

Apr. 13, 2012 (JP) ................................. 2012-092499
Apr. 13, 2012 (JP) ................................. 2012-092500

(51) Int. Cl.
*H05K 5/02* (2006.01)
*H04M 1/02* (2006.01)
*G06F 1/16* (2006.01)

(52) U.S. Cl.
CPC ............ *H05K 5/0217* (2013.01); *G06F 1/1656* (2013.01); *G06F 1/1675* (2013.01); *H04M 1/0237* (2013.01)

(58) Field of Classification Search
CPC .......... H02G 3/08; H02G 3/081; H05K 5/00; H05K 5/02; H05K 5/0217; H05K 5/0208; G11B 33/02; G11B 33/12; H04M 1/0237; G06F 1/1656; G06F 1/1675
USPC ........... 174/50, 53, 57, 58, 520, 66, 67, 17 R, 174/559; 220/3.2, 3.3, 4.02; 361/600, 601, 361/679.01, 679.02, 679.33, 679.34, 724, 361/730
See application file for complete search history.

(56) References Cited

U.S. PATENT DOCUMENTS 5,010,426 A * 4/1991 Krenz ...................... 361/679.33
6,394,509 B1 * 5/2002 Kurek, III ................ 361/679.33
(Continued)

FOREIGN PATENT DOCUMENTS

JP        62-42666        3/1987
JP        6-22483         3/1994
(Continued)

OTHER PUBLICATIONS

Japanese Notification of Reasons for Refusal dated Nov. 4, 2015 from corresponding Application No. 2012-092499.
(Continued)

*Primary Examiner* — Angel R Estrada
(74) *Attorney, Agent, or Firm* — Katten Muchin Rosenman LLP

(57) ABSTRACT

A slide cover has a engaged portion formed thereon. A rotatable member includes a stopper portion which is abutted against the engaged portion so as to restrict a relative movement of the engaged portion of the slide cover when the slide cover is arranged at a closed position. The stopper portion is positioned away from a rotation center of the rotatable member, and the rotatable member rotates to allow the relative movement of the engaged portion when the stopper portion is pushed by the engaged portion. This makes it possible to increase an angle between an stopper surface formed on the stopper portion and a movement direction (right-left direction) of the engaged portion. As a result, the cover is stably held at the closed position.

11 Claims, 17 Drawing Sheets

(56) References Cited

U.S. PATENT DOCUMENTS

| | | | |
|---|---|---|---|
| 6,979,209 B2* | 12/2005 | Griepentrog | 174/57 |
| 7,327,566 B2* | 2/2008 | Zhao | 361/679.33 |
| 7,687,711 B2 | 3/2010 | Kutaragi et al. | |
| 8,901,419 B2* | 12/2014 | Galasso | 174/53 |
| 2009/0290322 A1 | 11/2009 | Chang | |
| 2011/0200375 A1 | 8/2011 | Kowaka et al. | |

FOREIGN PATENT DOCUMENTS

| | | |
|---|---|---|
| JP | 7-57448 | 3/1995 |
| JP | 8-255390 | 10/1996 |
| JP | 2001-249419 | 9/2001 |
| JP | 2001-355367 | 12/2001 |
| JP | 2004-259808 | 9/2004 |
| JP | 2006-144419 | 6/2006 |
| JP | 2009-52270 | 3/2009 |

OTHER PUBLICATIONS

Japanese Notification of Reasons for Refusal dated Dec. 1, 2015 from corresponding Application No. 2012-092500.

* cited by examiner

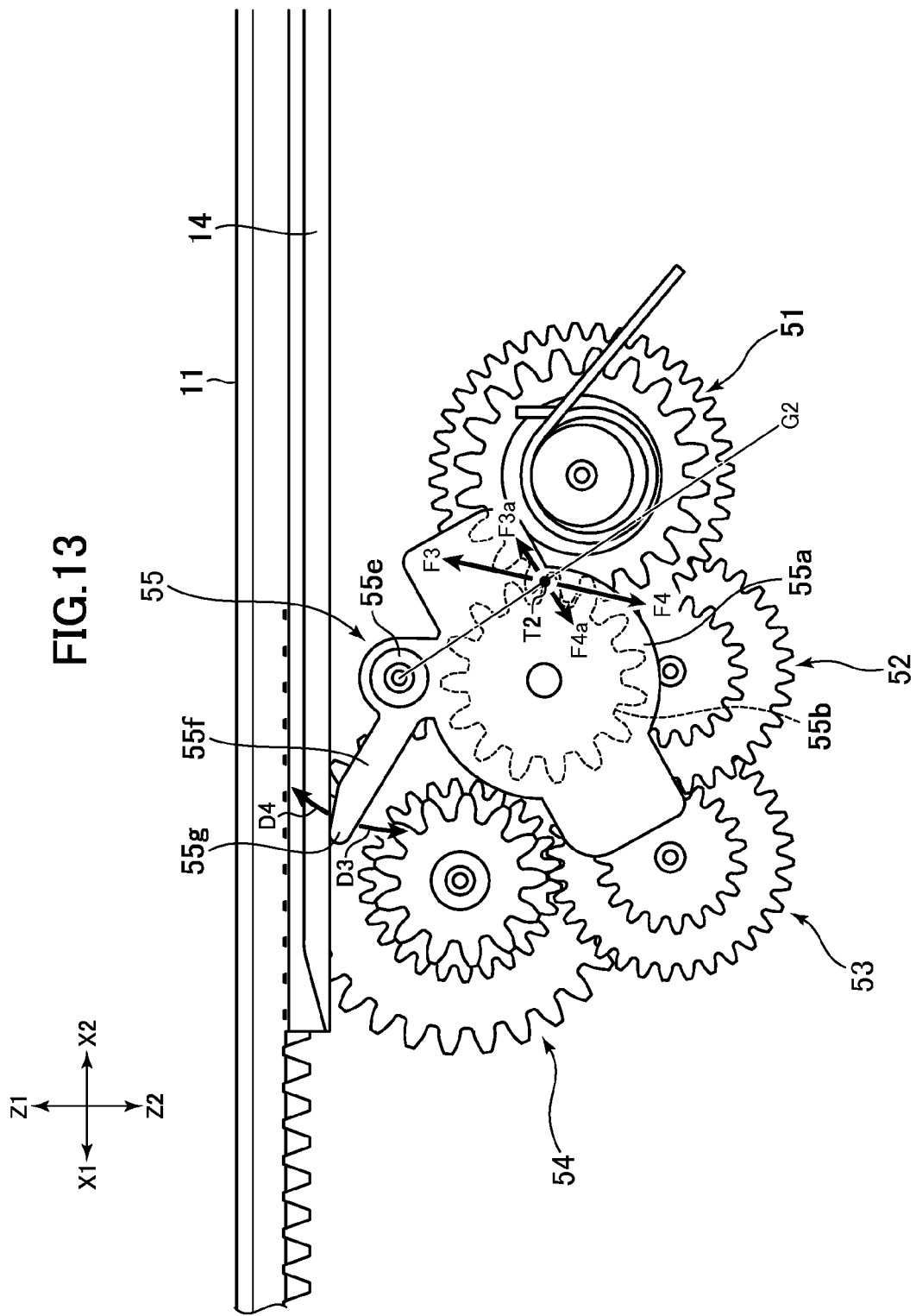

ELECTRONIC DEVICE

CROSS-REFERENCE TO RELATED APPLICATION

The present application claims priority from Japanese applications JP2012-092499 and JP2012-092500 filed on Apr. 13, 2012, the content of which is hereby incorporated by reference into this application.

BACKGROUND OF THE INVENTION

1. Field of the Invention

The present invention relates to an electronic device having an openable cover.

2. Description of the Related Art

Conveniently, electronic devices have been used which reproduce data stored in a portable storage medium such as an optical disc, or execute a program stored in the portable storage medium (for example, U.S. Pat. No. 7,687,711). The electronic device disclosed in U.S. Pat. No. 7,687,711 is provided with a slot for inserting the storage medium thereinto. Also, the electronic device disclosed in the above publication assumes both of use in a vertical posture and use in a horizontal posture.

SUMMARY OF THE INVENTION

The electronic device with the slot needs a loading mechanism that transports the storage medium, which has been inserted into the slot, to the inside of the electronic device. This mechanism includes relatively expensive parts such as a motor, and thus causes an increase in the costs of the electronic device. From this viewpoint, if a reading station in which the storage medium is arranged is covered with an openable cover which a user can open, components such as the motor are not required.

In the electronic device assuming both of use in the vertical posture and use in the horizontal posture, a direction of the gravity force exerted on the cover is different between the vertical posture and the horizontal direction of the electronic device. For that reason, even when the cover is gently opened in one posture of the electronic device, the gentle opening in the other posture is difficult to realize.

An electronic device according to a preferred embodiment of the present invention includes: a main body; a cover covering a part of the main body, and movable between an open position and a closed position with respect to the main body; an engaged portion provided to one of the main body and the cover, wherein the engaged portion moves relatively to the other one of the main body and the cover when the cover moves; a rotatable member provided to the other one of the main body and the cover; a first elastic member applying an elastic force against rotation of the rotatable member to the rotatable member. The rotatable member includes a stopper portion abutted against the engaged portion so as to restrict a relative movement of the engaged portion when the cover is placed at the closed position. The stopper portion is formed at a position away from a rotation center of the rotatable member, wherein the rotatable member rotates to allow the relative movement of the engaged portion when the stopper portion is pushed by the engaged portion. According to the electronic device of this embodiment, the cover is stably held at the closed position, and the user can open the cover as occasion demands.

An electronic device according to another preferred embodiment of the present invention includes: a cover movable between an open position and a closed position; a movable portion which moves due to the movement of the cover; and a damper member that is supported so as to move between a first position and a second position when the posture of the electronic device changes. The first position is where the damper member is engaged with the movable portion to function as a resistance against the movement of the movable portion. The second position is where the engagement between the damper member and the movable portion is released. According to the electronic device, the gentle opening of the cover can be realized without depending on the change in the posture of the electronic device.

BRIEF DESCRIPTION OF THE DRAWINGS

FIGS. 1A and 1B are diagrams illustrating an electronic device according to an embodiment of the present invention, in which FIG. 1A is a plan view thereof, and FIG. 1B is a front view thereof;

FIGS. 4A and 4B are cross-sectional views taken along a line IV-IV illustrated in FIG. 3, in which FIG. 4B is an enlarged diagram of a portion indicated by IVB in FIG. 4A;

FIGS. 6A, 6B, and 6C are diagrams illustrating the movement of the rotatable member, in which FIGS. 6A and 6B illustrate the movement of the rotatable member when the slide cover is manually opened, and FIG. 6C illustrates the movement of the rotatable member when the slide cover is manually closed;

FIGS. 7A, 7B, and 7C are diagrams illustrating the movement of the rotatable member, in which FIGS. 7A and 7B illustrate the movement of the rotatable member when the slide cover is opened by the operation of the operation member, and FIG. 7C illustrates the movement of the rotatable member when the slide cover is manually closed;

FIG. 13 is a front view of the drive mechanism, which shows an appearance of the slide cover moved in a state where the electronic device is horizontally arranged;

DETAILED DESCRIPTION OF THE INVENTION

Figure 1A:
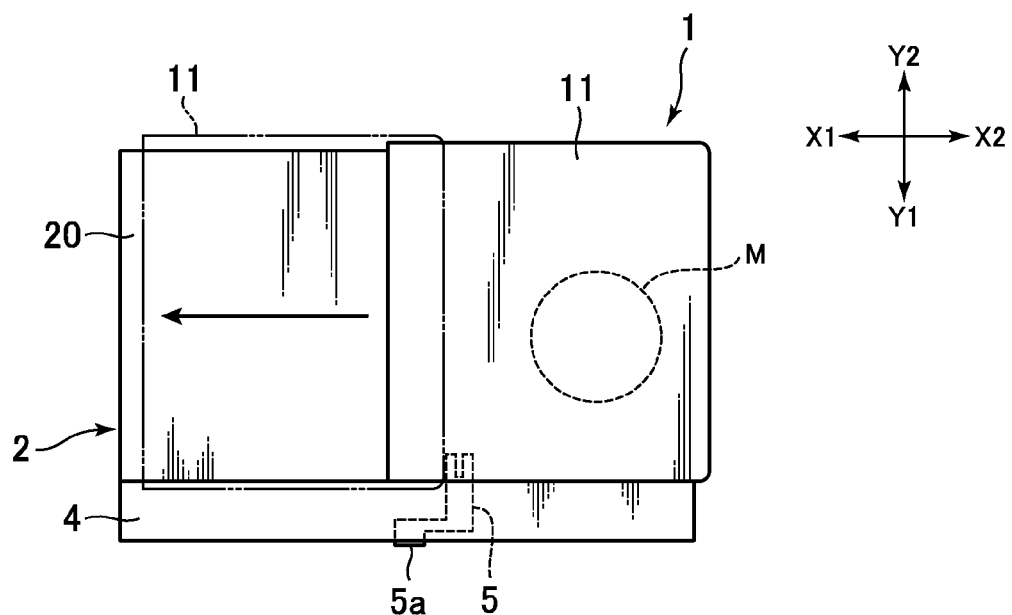
Figure 1B:
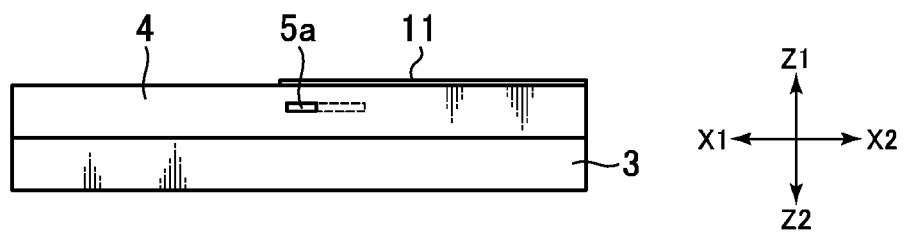

Hereinafter, an embodiment of the present invention will be described with reference to the accompanying drawings. FIGS. 1A and 1B are diagrams illustrating an electronic device according to an embodiment of the present invention. FIG. 1A is a plan view thereof, and FIG. 1B is a front view thereof. In the following description, X1 and X2 illustrated in FIG. 1 denote a left direction and a right direction, respectively, Y1 and Y2 denote a front direction and a rear direction, respectively, and Z1 and Z2 denote an upper direction and a lower direction, respectively.

An electronic device 1 includes a main body 2. The main body 2 includes a lower housing 3 and an upper housing 20. Those housings 3 and 20 are combined together in a vertical direction to configure a housing that receives a circuit board. The electronic device 1 in this example reproduces moving image data stored in an optical disc M, and executes a program stored in the optical disc M. A disc arrangement region (a read position of the optical disc M) in which the optical disc M is placed is defined on an upper side of the upper housing 20. For example, the upper housing 20 has a recess having a shape corresponding to the optical disc M, and the recess is employed as the disc arrangement region. The electronic device 1 includes a slide cover 11. In this example, the slide cover 11 is formed like a plate. The slide cover 11 is slidable between a closed position (position of the slide cover 11 indicated by a solid line in FIG. 1A) at which the slide cover 11 covers the disc arrangement region of the upper housing 20, and an open position (position of the slide cover 11 indicated by a two-dot chain line in FIG. 1A) at which the slide cover 11 exposes the disc arrangement region. In this example, the disc arrangement region is formed on a right portion of the upper housing 20, and the slide cover 11 covers the right portion of the upper housing 20. The electronic device 1 includes a front cover 4 in a front portion thereof. The front cover 4 covers an operation member 5 for allowing a user to open the slide cover 11, and a drive mechanism G (FIG. 8) of the slide cover 11 which will be described later.

Figure 2:
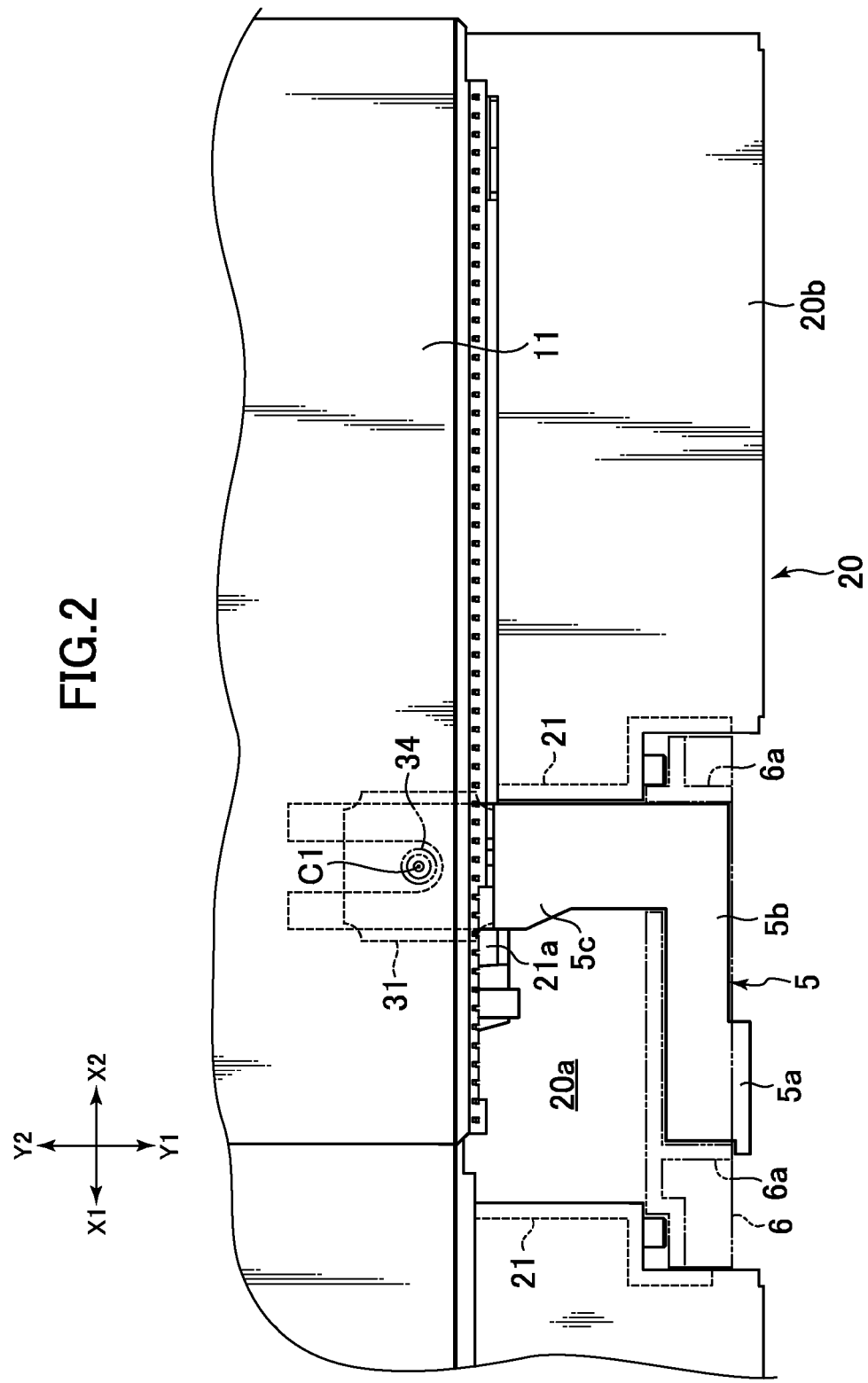
FIG. 2 is a plan view of a front portion of the electronic device in which a front cover is removed, and an operation member is shown.
Figure 3:
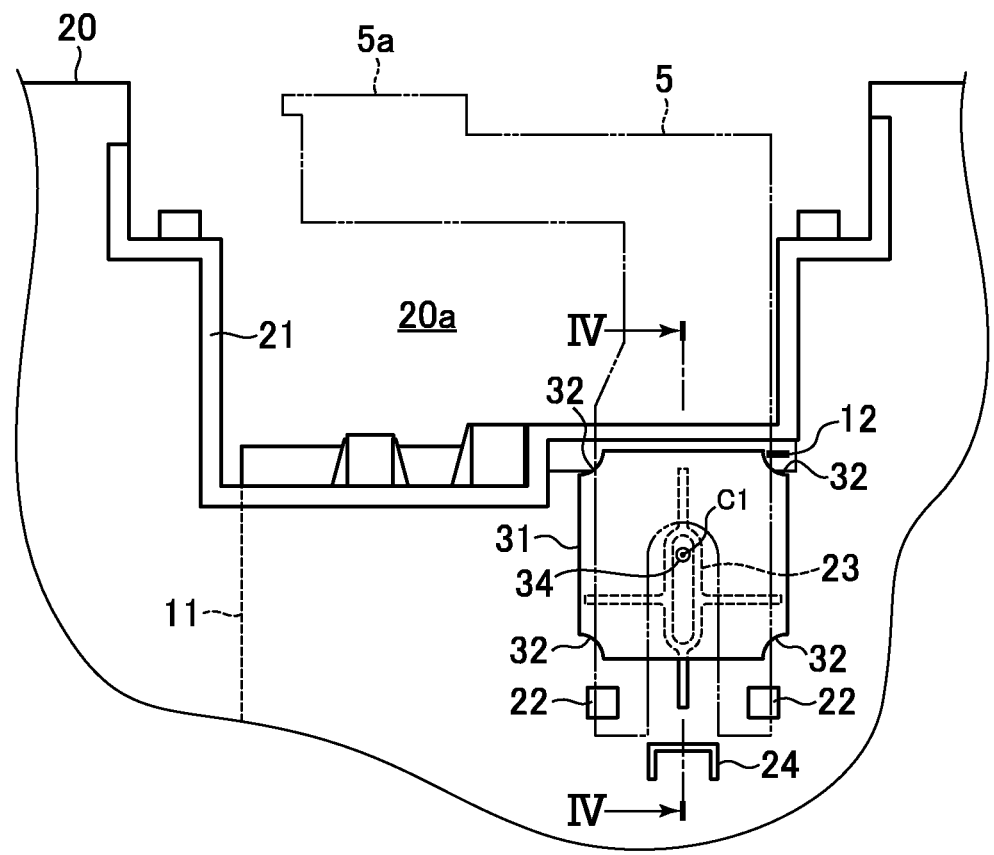
FIG. 3 is a diagram illustrating a rear side of an upper housing provided in the electronic device.
Figure 4A:
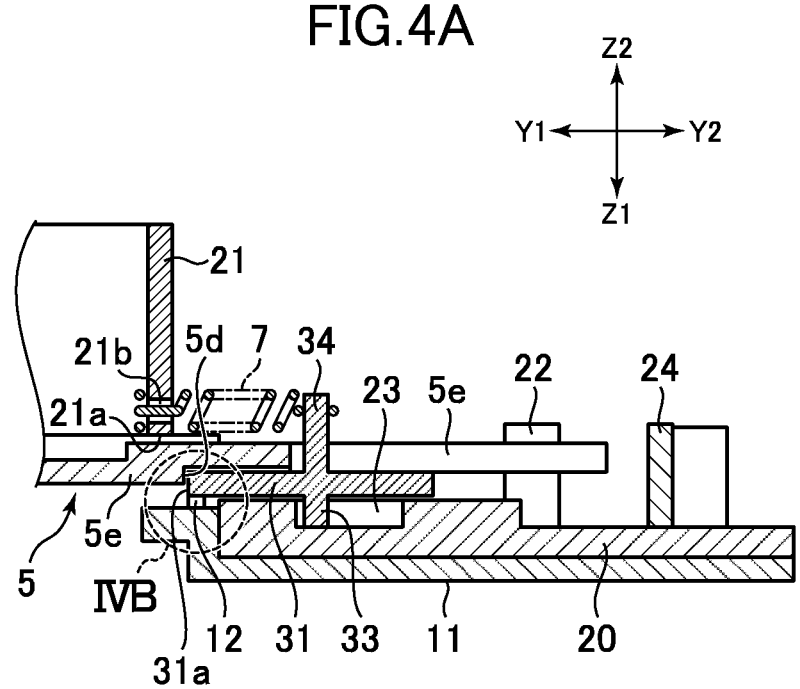
Figure 4B:
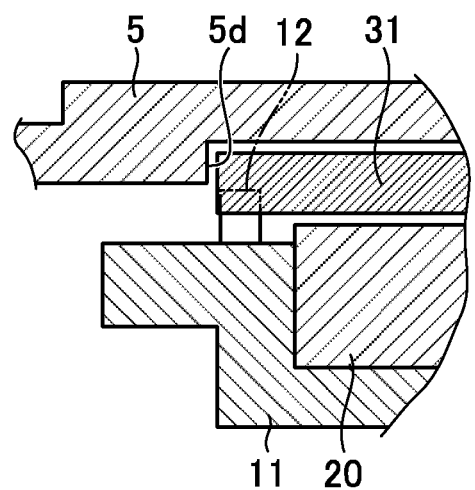
Figure 5A:
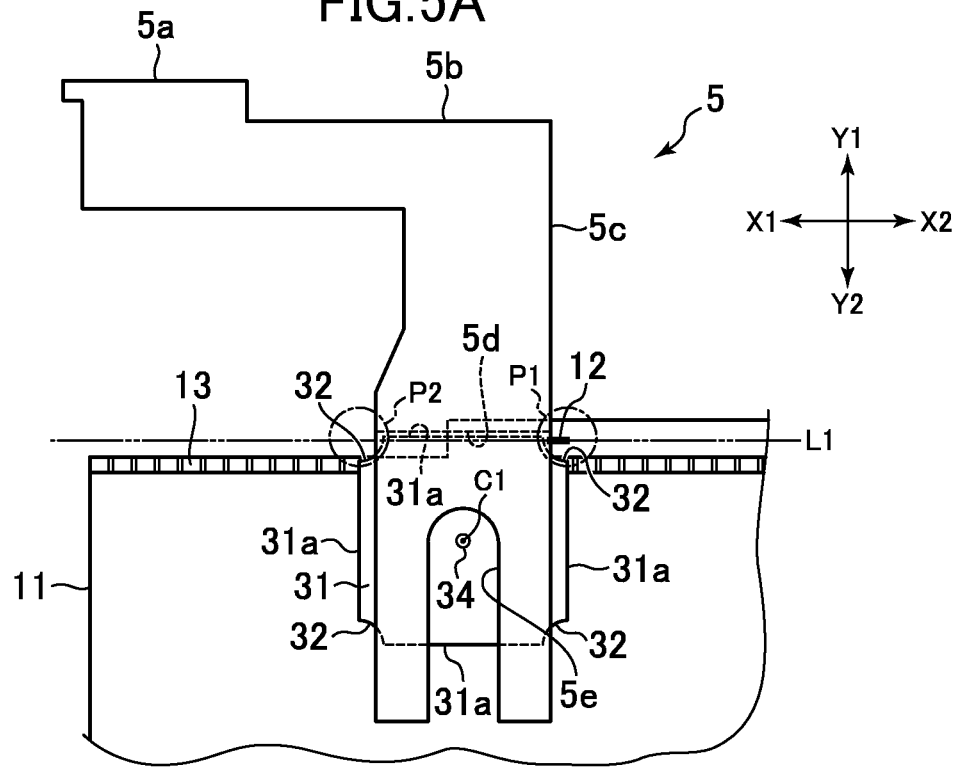
FIGS. 5A and 5B are diagrams illustrating a positional relationship of the operation member, a slide cover, and a rotatable member.
Figure 5B:
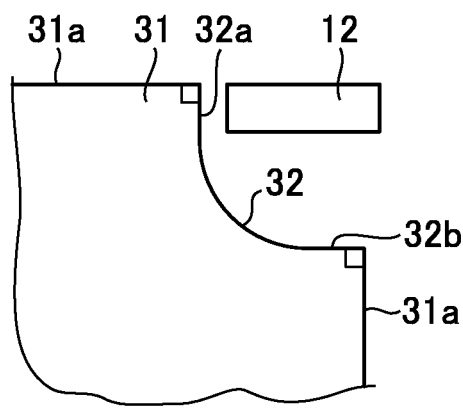
Figure 6A:
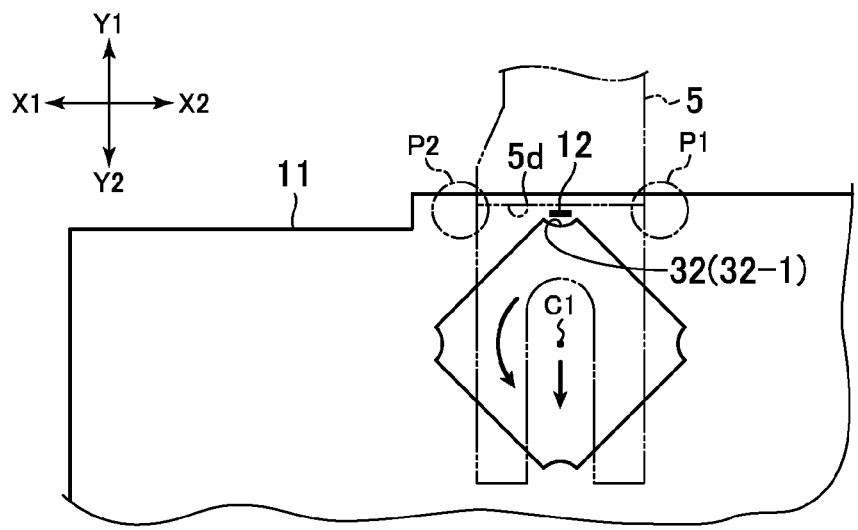
Figure 6B:
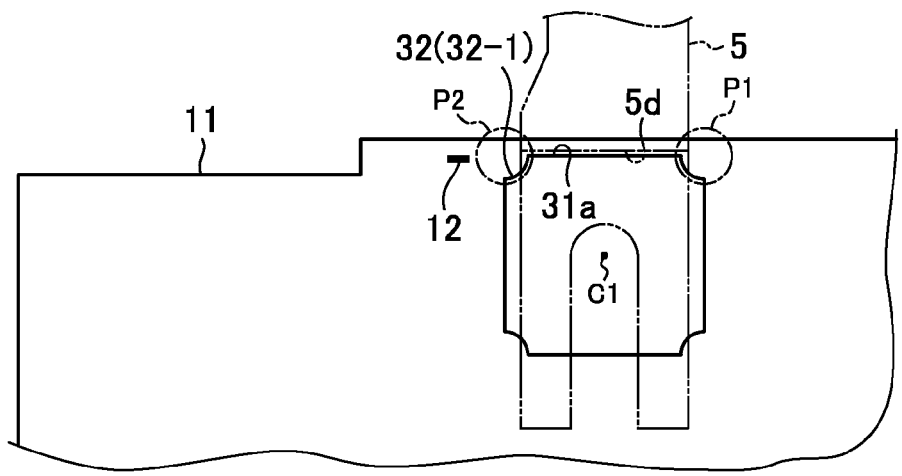
Figure 6C:
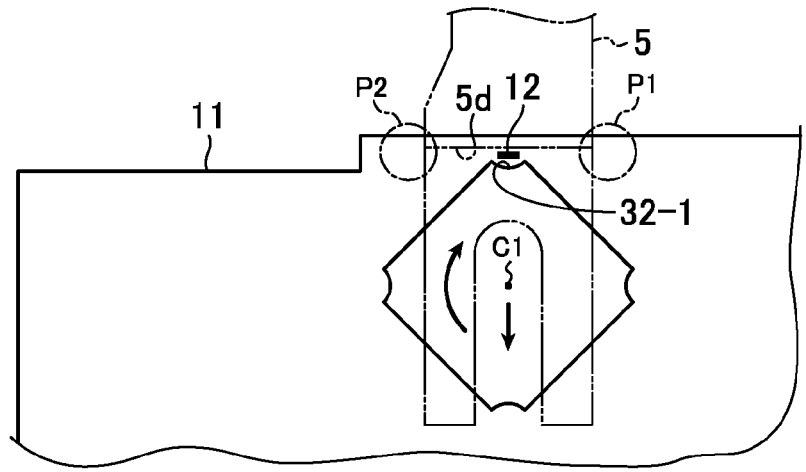
Figure 7A:
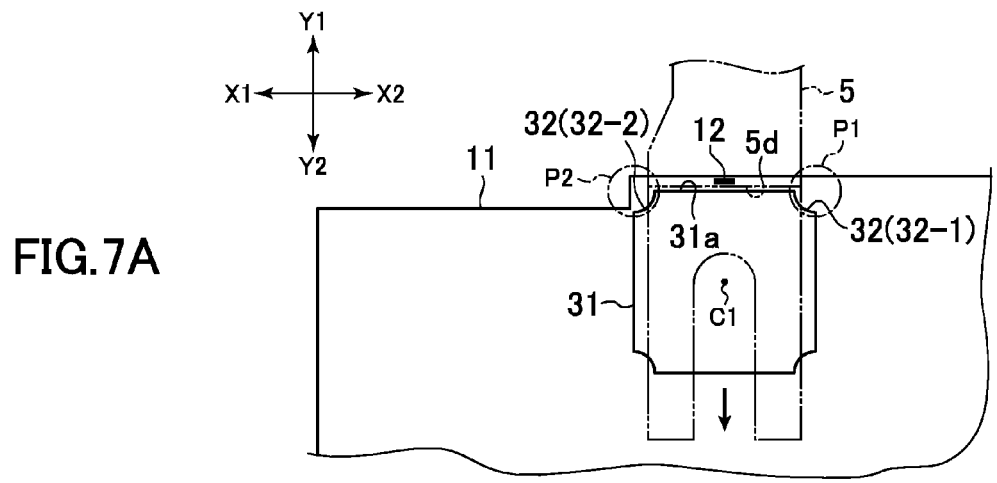
Figure 7B:
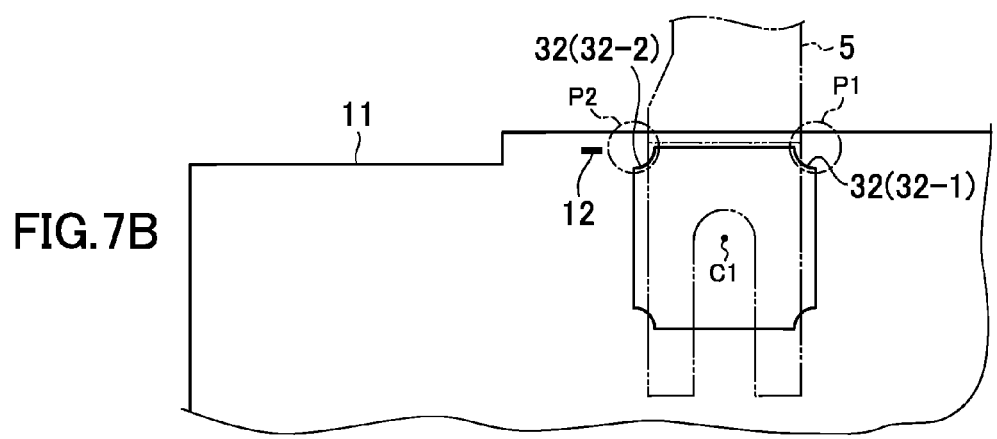
Figure 7C:
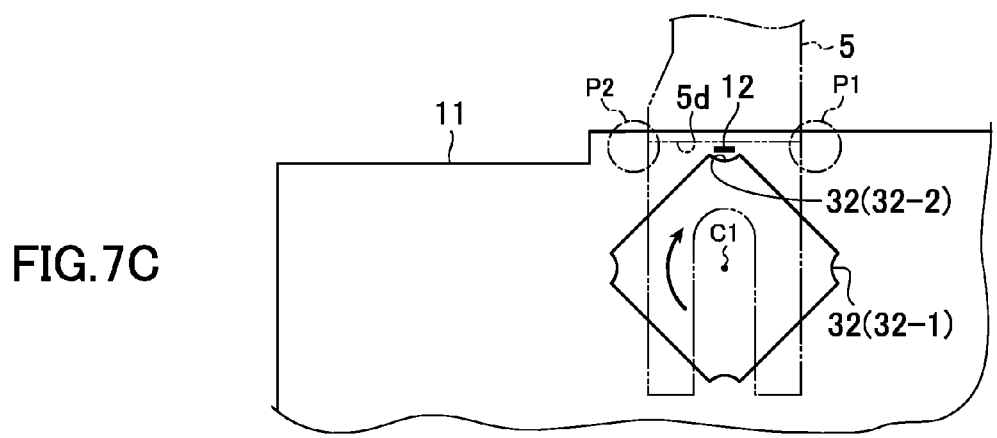

FIG. 2 is a plan view of the front portion of the electronic device 1. In the figure, the front cover 4 is removed, and thus the operation member 5 is shown. Further, the drive mechanism G of the slide cover 11 is omitted. FIG. 3 is a diagram illustrating a lower side of the upper housing 20. FIGS. 4A and 4B are cross-sectional views taken along a line IV-IV illustrated in FIG. 3, in which FIG. 4B is an enlarged diagram of a portion indicated by IVB in FIG. 4A. FIGS. 5A and 5B are diagrams illustrating a positional relationship of the operation member 5, the slide cover 11, and a rotatable member 31. FIGS. 6A to 6C and 7A to 7C are diagrams illustrating the movement of the rotatable member 31. As will be described later, the slide cover 11 can be opened by both of manual operation by the user and the operation of the operation member 5. Further, the slide cover 11 can be closed by the manual operation of the user. The manual operation means an operation that a user pushes the slide cover 11 per se to open and close the slide cover 11. FIGS. 6A and 6B illustrate the movement of the rotatable member 31 when the user manually opens the slide cover 11, and FIG. 6C illustrates the movement of the rotatable member 31 when the user manually closes the slide cover 11. FIGS. 7A and 7B illustrate the movement of the rotatable member 31 when the user opens the slide cover 11 by the operation of the operation member 5, and FIG. 7C illustrates the movement of the rotatable member 31 when the user manually closes the slide cover 11.

As illustrated in FIG. 2, the electronic device 1 includes an operation member 5. The operation member 5 is employed as an open button for the user to open the slide cover 11. The operation member 5 includes an operated portion 5a projected forward on an end thereof. The operated portion 5a is located on a front surface of the electronic device 1 (refer to FIG. 1). As will be described later, the user can open the slide cover 11 by pushing the operated portion 5a.

As illustrated in FIG. 2, the operation member 5 in this example is substantially L-shaped in a plan view. That is, the operation member 5 includes a front extension portion 5b which is formed in a front portion thereof, and elongated in a right-left direction. Further, the operation member 5 includes a rear extension portion 5c which is extended to the rear from the end of the front extension portion 5b. The operated portion 5a is formed on the end opposite to the rear extension portion 5c. With the shape of the operation member 5, while the operated portion 5a is positioned substantially in the center of the electronic device 1 in the right-left direction, the operation member 5 can move a rotatable member 31 to be described later, positioned offset from the center of the electronic device 1 in the right-left direction.

The operation member 5 is so guided as to move in the front-rear direction. In this example, as illustrated in FIG. 2, a holder 6 is attached to the upper housing 20. The holder 6 includes a pair of guide walls 6a between which the front extension portion 5b is arranged. As illustrated in FIG. 3, the rear extension portion 5c extends to the lower surface of the upper housing 20. The lower surface (back surface) of the upper housing 20 has a pair of guide walls 22 formed thereon inside of which the rear end of the rear extension portion 5c is arranged. The guide walls 6a and 22t guide the operation member 5 to move in the front-rear direction. When a user presses the operated portion 5a, the operation member 5 is moved rearward. The upper housing 20 includes, in the rear of the rear extension portion 5c, a stopper 24 for restricting a movable range of the operation member 5.

In this example, as illustrated in FIG. 2, the upper housing 20 includes, in the front portion thereof, a front panel portion 20b positioned lower than the rear portion of the upper housing 20 in which the disc arrangement region is formed. The front panel portion 20b has a recess 20a concaved rearward in a plan view of the electronic device 1, in the center of the front panel portion 20b in the right-left direction. The upper housing 20 includes a front wall portion 21 extending downward from an edge of the recess 20a and defining the inner space of the recess 20a. The holder 6 is attached to the front wall portion 21. The rear extension portion 5c extends to the lower side of the upper housing 20 through a hole 21a formed in the front wall portion 21 (refer to FIG. 4B).

As illustrated in FIG. 3, the rotatable member 31 is provided to the upper housing 20. The rotatable member 31 is arranged along the lower surface of the upper housing 20, and rotatable around an axis along a direction (vertical direction) perpendicular to the movement direction (right-left direction) of the slide cover 11. As illustrated in FIG. 5A, the slide cover 11 is provided with an engaged portion 12. In this example, the engaged portion 12 protrudes downward from the front edge of the slide cover 11. As described above, the slide cover 11 is laterally slidable between the open position and the closed position. For that reason, the engaged portion 12 moves relatively laterally with respect to the upper housing 20 and the rotatable member 31 when the slide cover 11 moves. The rotatable member 31 includes a stopper portion 32 which is abutted against the engaged portion 12 so as to restrict the movement of the engaged portion 12 in a state where the slide cover 11 is arranged at the closed position. In a state where the stopper portion 32 is abutted against the engaged portion 12, the movement of the slide cover 11 from the closed position toward the open position is restricted.

As illustrated in FIG. 3, the stopper portion 32 is formed at a position away from the rotation center C1 of the rotatable member 31. The rotatable member 31 includes a plurality of stopper portions 32 which are formed at regular intervals in the peripheral direction around the rotation center C1. In this example, the rotatable member 31 is substantially formed into a polygonal shape. The plurality of stopper portions 32 are formed at the respective corners of the shape. The rotatable member 31 in this example is square, and thus includes four of the stopper portions 32. The rotatable member 31 rotates when any stopper portion 32 are pushed by the engaged portion 12, and then allows the movement of the engaged portion 12, that is, the slide of the slide cover 11.

The engaged portion 12 moves along a straight line L1 along a slide direction (right-left direction) of the slide cover 11 when the slide cover 11 slides (refer to FIG. 5A). As will be described later, the rotatable member 31 is movable in a direction perpendicular to both of the movement direction of the engaged portion 12 and the axis passing through the rotation center C1 of the rotatable member 31. In this example, the rotatable member 31 is movable in the front-rear direction. As illustrated in FIG. 4A, a spring 7 is arranged on the lower side of the upper housing 20. The rotation of the rotatable member 31 is suppressed by the spring 7. In more detail, the spring 7 employs a tension spring, and urges the rotatable member 31 forward. The operation member 5 includes a stopper pushing surface (abutment surface) 5d. The stopper pushing surface is positioned in front of the rotatable member 31, and faces the rotatable member 31. The stopper pushing surface 5d is a flat surface facing rearward and extending in the right-left direction. As illustrated in FIG. 3, the rotatable member 31 includes a flat surface (hereinafter referred to as "pushed surface") 31a which is pushed toward the stopper pushing surface 5d by the elastic force of the spring 7. The pushed surface 31a is pushed toward the stopper pushing surface 5d to thereby suppress the rotation of the rotatable member 31.

In this example, each of the plurality of sides (four sides in this example) of the rotatable member 31 functions as the pushed surface 31a. In a state where any pushed surface 31a is abutted against the stopper pushing surface 5d, the stopper portions 32 are positioned on the movement course of the engaged portion 12 along the straight line L1. The stopper portions 32 are formed at both ends of the pushed surface 31a. For that reason, two positions (positions indicated by P1 and P2 in FIG. 5A) at which the stopper portions 32 are arranged are defined on the movement course of the engaged portion 12. When the pushed surface 31a is pushed toward the stopper pushing surface 5d, two of the stopper portions 32 are arranged at the two respective positions P1 and P2.

As illustrated in FIG. 5A, when the pushed surface 31a is pushed toward the stopper pushing surface 5d, a distance from the rotation center C1 to the ends (stopper portions 32 in this example) of the pushed surface 31a is larger than a distance from the rotation center C1 to the stopper pushing surface 5d. For that reason, when the user is to manually move the slide cover 11 from the closed position toward the open position, as illustrated in FIG. 6A, the rotatable member 31 rotates to move rearward against the elastic force of the spring 7. That is, the engaged portion 12 allows the rotatable member 31 to rotate against the elastic force of the spring 7. When the rotatable member 31 rotates, the movement restriction of the engaged portion 12 by the stopper portions 32, that is, lock of the slide cover 11 is canceled, and thus the slide cover 11 moves to the open position (FIG. 6B).

When the rotatable member 31 rotates, the stopper portion 32 moves from one position (position indicated by P1 in FIG. 6) where the stopper portion 32 is engaged with the engaged portion 12 to another position (position indicated by P2 in FIG. 6) on the movement course of the engaged portion 12 (hereinafter, P1 is called "first stopper position, and P2 is called "second stopper position"). Until the stopper portion 32 reaches the intermediate position (position of the stopper portion 32 illustrated in FIG. 6A) between the first stopper position P1 and the second stopper position P2, the elastic force of the spring 7 acts against the rotation of the rotatable member 31 because the rotatable member 31 moves rearward. When the stopper portion 32 passes the intermediate position, the elastic force of the spring 7 prompts the rotation of the rotatable member 31. In this example, the rotatable member 31 includes the four stopper portions 32, and thus the rotatable member 31 rotates by 90 degrees by one movement of the slide cover 11. The elastic force of the spring 7 acts against the rotation of the rotatable member 31 until the rotatable member 31 rotates by 45 degrees. Then, when the rotation of the rotatable member 31 exceeds 45 degrees, the elastic force of the spring 7 prompts the rotation of the rotatable member 31. Then, the engaged portion 12 receives the force from the stopper portion 32 to be pushed out in its movement direction.

As illustrated in FIG. 5B, the stopper portion 32 includes an stopper surface 32a to be abutted against the engaged portion 12 of the slide cover 11. In this example, the stopper portion 32 is a recess formed in each corner of the rotatable member 31. An inner surface of the recess functions as the stopper portion 32. According to the structure of this embodiment in which the movement of the slide cover 11 is restricted by the rotatable rotatable member 31, the angle between the stopper surface 32a and the movement direction (right-left direction) of the engaged portion 12 can be increased. In this example, the stopper surface 32a is formed perpendicularly to the movement direction of the engaged portion 12 of the slide cover 11. As a result, the slide cover 11 can be stably held at the closed position. As will be described in detail later, each of the stopper portions 32 includes two stopper surfaces 32a and 32b so that the elastic force of the spring 7 is applied to the slide cover 11 even when the slide cover 11 returns from the open position to the closed position. The first stopper surface 32a is abutted against the engaged portion 12 of the slide cover 11 when the slide cover 11 moves from the closed position to the open position. The second stopper surface 32b is abutted against the engaged portion 12 when the slide cover 11 moves from the open position to the closed position. The second stopper surface 32b is also formed perpendicularly to the movement direction of the engaged portion 12 of the slide cover 11.

As described above, the rotatable member 31 is relatively movable away from the movement course (along the straight line L1) of the engaged portion 12 in the direction (rearward in this example) perpendicular to the movement direction of the engaged portion 12. That is, the rotatable member 31 is movable in the direction apart from the movement course of the engaged portion 12. The upper housing 20 includes a guide which allows the rotation of the rotatable member 31, and guides the rotatable member 31 in the front-rear direction. In more detail, as illustrated in FIG. 4A, the rotatable member 31 includes a shaft 33 at the rotation center C1 thereof. The shaft 33 is protruded from the rotatable member 31 toward the upper housing 20. As illustrated in FIGS. 3 and 4A, the upper housing 20 includes a guide 23 protruded from the lower surface of the upper housing 20. The guide 23 surrounds the shaft 33, and is elongated in the front-rear direction. As a result, the rotatable member 31 moves in the front-rear direction along the guide 23.

As described above, the operation member 5 moves rearward by the operation of a user. In other words, the rotatable member 31 moves in the direction apart from the movement course of the engaged portion 12 by the operation of a user. When the operated portion 5a is pushed by the user, the operation member 5 moves the rotatable member 31 rearward through the stopper pushing surface 5d. The slide cover 11 is urged toward the open position by a spring 59 (FIG. 8) disposed in the drive mechanism G which will be described later. With this structure, the user can open the slide cover 11 by not only the manual operation, but also the operation of the operation member 5. That is, as illustrated in FIG. 7A, when the operated portion 5a is pushed, the operation member 5 moves the rotatable member 31 rearward from the movement course of the engaged portion 12. As a result, the movement restriction of the engaged portion 12 by the stopper portion 32 is canceled. Then, the slide cover 11 moves toward the open position by the action of the spring 59. As illustrated in FIG. 4B, the stopper pushing surface 5d of the operation member 5 and the engaged portion 12 of the slide cover 11 are positionally vertically displaced from each other. In FIG. 4B, the engaged portion 12 is positioned lower than the stopper pushing surface 5d. For that reason, even if the operation member 5 is pushed to move rearward, the engaged portion 12 does not interfere with the operation member 5.

As described above, the spring 7 urging the rotatable member 31 forward is arranged on the lower side of the upper housing 20. As illustrated in FIG. 4A, the rotatable member 31 includes a shaft 34 protruded toward a side opposite to the shaft 33 in the rotation center C1. One end of the spring 7 catches on the shaft 34. The other end of the spring 7 catches on the front wall portion 21 of the upper housing 20. In this example, the front wall portion 21 has a hole 21b formed thereon, and the other end of the spring 7 catches on the edge of the hole 21b. The spring 7 pulls the shaft 34 toward the front wall portion 21. As a result, the rotatable member 31 is urged forward, and pushes the operation member 5 toward an initial position (in this example, the initial position of the operation member 5 is where the operated portion 5a is not pushed by the user). For that reason, when a user releases pushing of the operated portion 5a of the operation member 5, the operation member 5 returns to the initial position. The operation member 5 has a recess 5e formed thereon for avoiding an interference of the shaft 34 with the operation member 5 (refer to FIG. 5A).

The plurality of stopper portions 32 formed in the rotatable member 31 are arranged at regular intervals in the peripheral direction around the rotation center C1 of the rotatable member 31. The rotatable member 31 has a polygonal shape which is rotationally symmetrical around the rotation center C1, and thus the plurality of stopper portions 32 are formed at the respective corners of the polygonal shape. The rotatable member 31 in this example is shaped into a square, and thus the stopper portions 32 are formed in the respective four corners. Each of the four sides of the square functions as the above-mentioned pushed surface 31a. The stopper portions 32 are positioned on both ends of the pushed surface 31a. For that reason, the movement course of the engaged portion 12 has two positions (that is, the first stopper position P1 and the second stopper position P2) defined thereon where the stopper portions 32 are arranged. The respective stopper portions 32 are moved to those two positions by the rotation of the rotatable member 31. The first stopper position P1 indicated in FIG. 5A is where the stopper portions 32 is abutted against the engaged portion 12 when the slide cover 11 arranged at the closed position. The stopper portion 32 is arranged at the second stopper position P2 after the rotatable member 31 has rotated due to the movement of the slide cover 11 from the closed position to the open position.

The rotatable member 31 includes the plurality of stopper portions 32, and the two stopper positions P1 and P2 are defined on the movement course of the engaged portion 12. As a result, in both of a case where the slide cover 11 is manually closed after the slide cover 11 was manually opened, and a case where the slide cover 11 is manually closed after the slide cover 11 was opened by pushing the operation member 5, the elastic force of the spring 7 acts against the movement of the slide cover 11 form the open position to the closed position.

A description will be given of a case in which the user manually closes the slide cover 11 after manually opening the slide cover 11 with reference to FIGS. 6A, 6B, and 6C. As illustrated in FIGS. 6A and 6B, the stopper portion (indicated by reference numeral 32-1 in FIGS. 6A, 6B, and 6C) is arranged at the first stopper position P1 at first, and then is pushed by the engaged portion 12 to move to the second stopper position P2 by the counterclockwise rotation of the rotatable member 31. As the result, the slide cover 11 is moved to the open position. Thereafter, as illustrated in FIG. 6C, when the slide cover 11 is to be moved from the open position to the closed position, the engaged portion 12 again pushes the stopper portion 32-1, and rotates the rotatable member 31 clockwise. In this situation, the rotatable member 31 temporarily moves rearward against the elastic force of the spring 7. That is, the elastic force of the spring 7 acts as a force against the movement of the slide cover 11 to the closed position. After the rotatable member 31 rotates against the elastic force of the spring 7, the stopper portion 32-1 returns to the first stopper position P1. When the stopper portion 32-1 exceeds an intermediate position between the first stopper position P1 and the second stopper position P2, the elastic force of the spring 7 prompts the clockwise rotation of the rotatable member 31.

A description will be given of a casein which the slide cover 11 is closed by the manual operation after the user pushes the operation member 5 to open the slide cover 11 with reference to FIGS. 7A, 7B, and 7C. In this case, as illustrated in FIGS. 7A and 7B, the movement of the slide cover 11 is allowed by the rearward movement of the rotatable member 31. For that reason, the stopper portion (stopper portion indicated by reference numeral 32-1 in FIGS. 7A, 7B, and 7C) arranged at the first stopper position P1 remains at the position of the first stopper position P1 even after the slide cover 11 has moved to the open position. As illustrated in FIG. 7C, when the slide cover 11 moves from the open position to the closed position, the engaged portion 12 pushes the stopper portion (stopper portion indicated by reference numeral 32-2 in FIGS. 7A, 7B, and 7C) arranged at the second stopper position P2, and rotates the rotatable member 31 clockwise. In this situation, the rotatable member 31 temporarily moves rearward against the elastic force of the spring 7. Thereafter, the stopper portion 32-2 is positioned at the first stopper position P1. When the opening of the slide cover 11 by the operation of the operation member 5 and the closing of the slide cover 11 by the manual operation are repeated, the rotatable member 31 rotates in the same direction (clockwise direction in this example). As a result, the stopper portions 32 arranged at the first stopper position P1 and the second stopper position P2 are replaced with each other in order.

The rotatable member 31 has a shape rotationally symmetrical around the rotation center C1. For that reason, each of the stopper portions 32 has two stopper surfaces 32a and 32b as illustrated in FIG. 5B. When the slide cover 11 moves from the open position to the closed position, the engaged portion 12 is abutted against the second stopper surface 32b. According to the structure of this embodiment in which the movement of the slide cover 11 is restricted by the rotatable rotatable member 31, the angle between the movement direction (right-left direction) of the engaged portion 12 and the stopper surface 32b can be increased.

Figure 8:
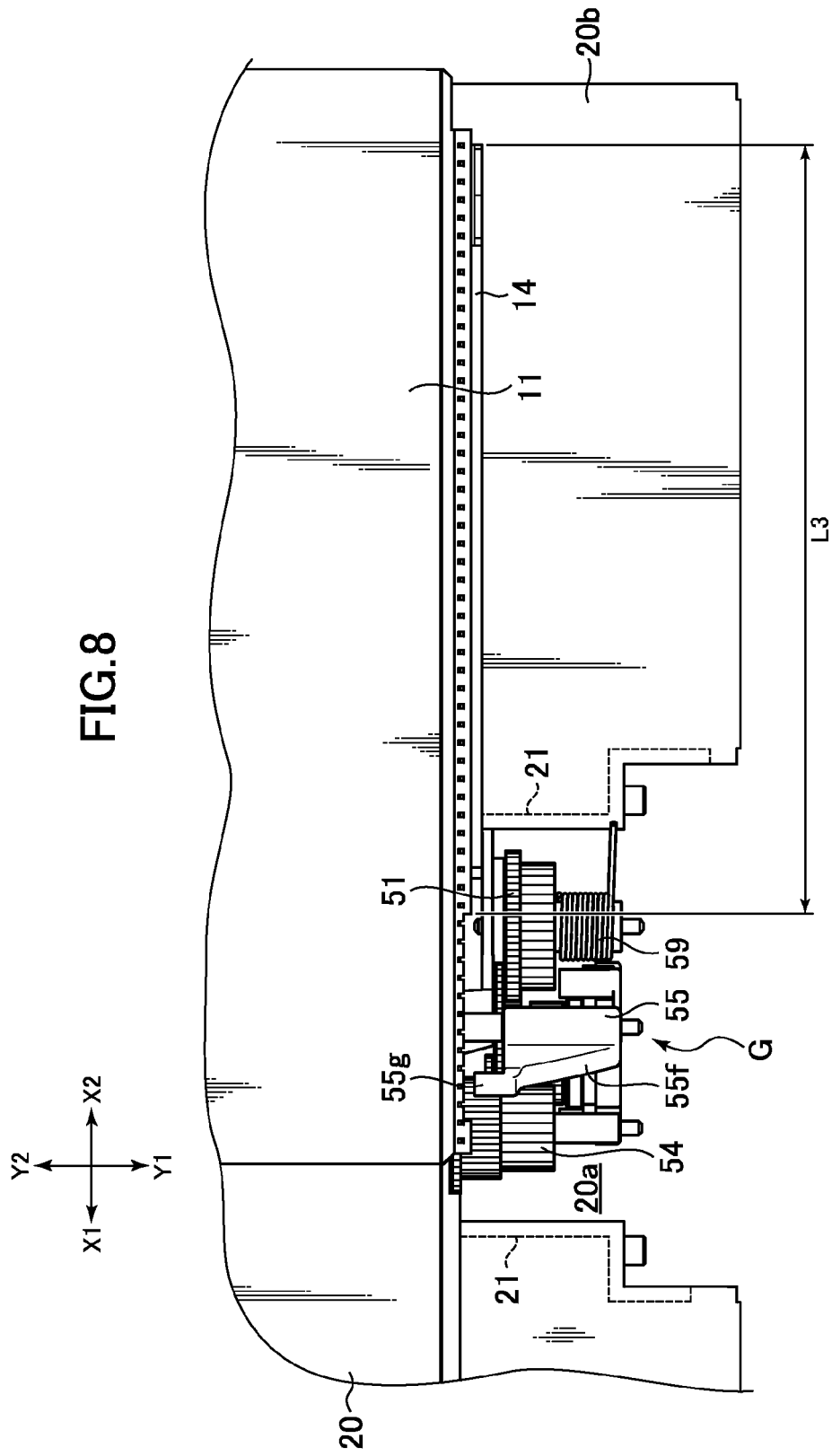
FIG. 8 is a plan view of the front portion of the electronic device in which the front cover is removed, and a drive mechanism for the slide cover is shown.
Figure 9:
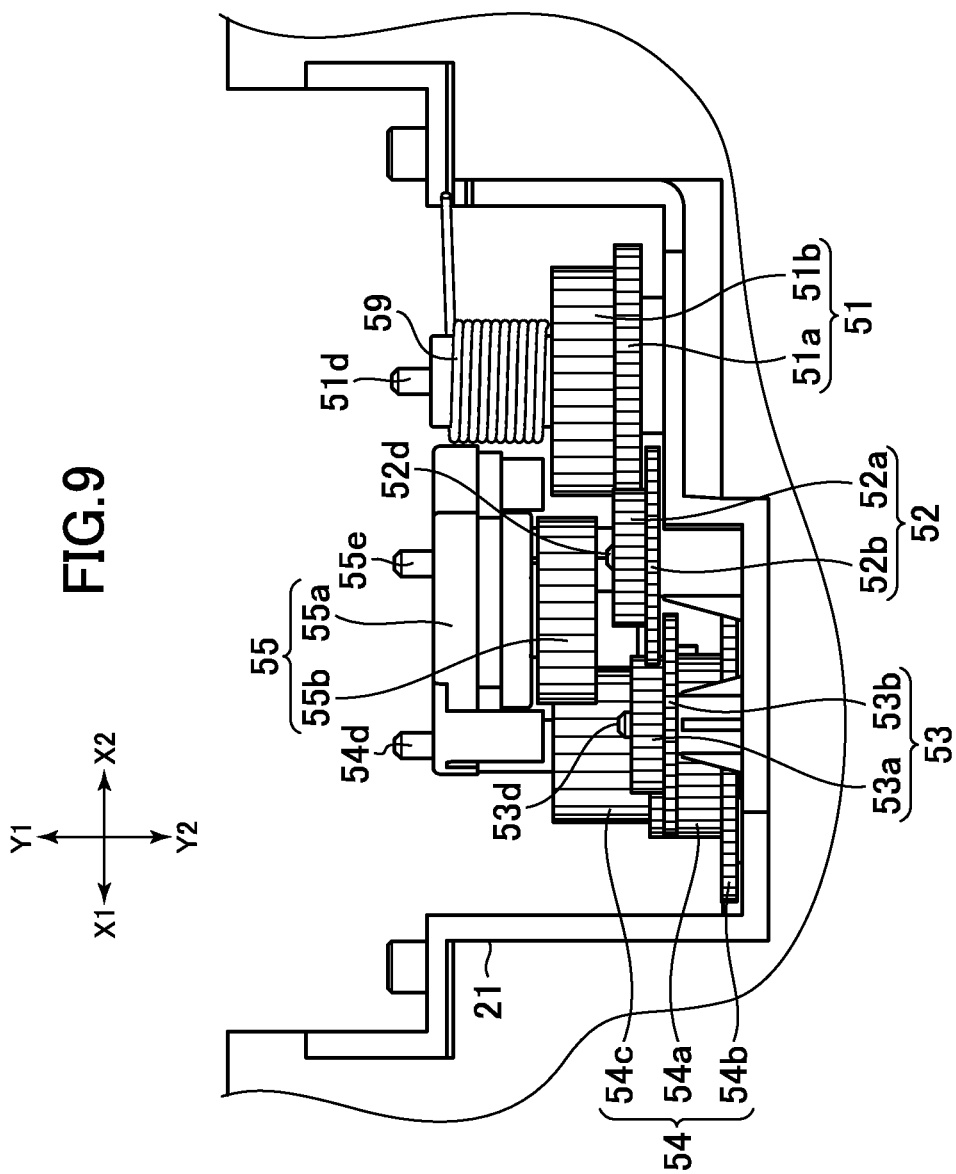
FIG. 9 is a diagram of the drive mechanism viewed from a lower side of the upper housing.

The drive mechanism for moving the slide cover 11 will be described. FIG. 8 is a plan view of the front portion of the electronic device 1. In FIG. 8, the front cover 4 is removed, and thus the drive mechanism G of the slide cover 11 is shown. FIG. 9 is a diagram of the drive mechanism G viewed from the lower side of the upper housing 20. FIGS. 10 to 13 are front views of the drive mechanism G.

Figure 10:
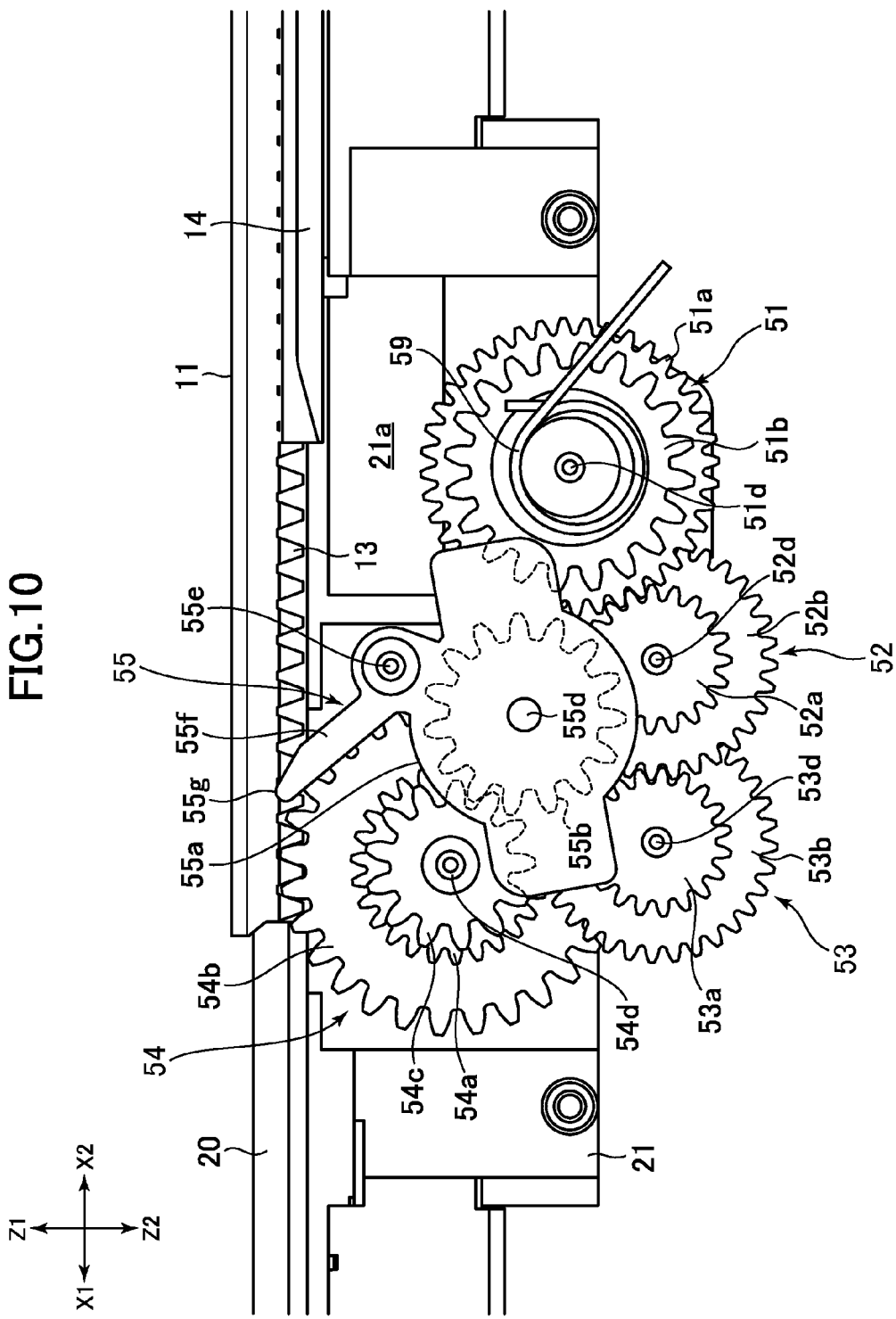
FIG. 10 is a front view of the drive mechanism, which shows the damper located at a position when the electronic device is vertically arranged is shown.
Figure 11:
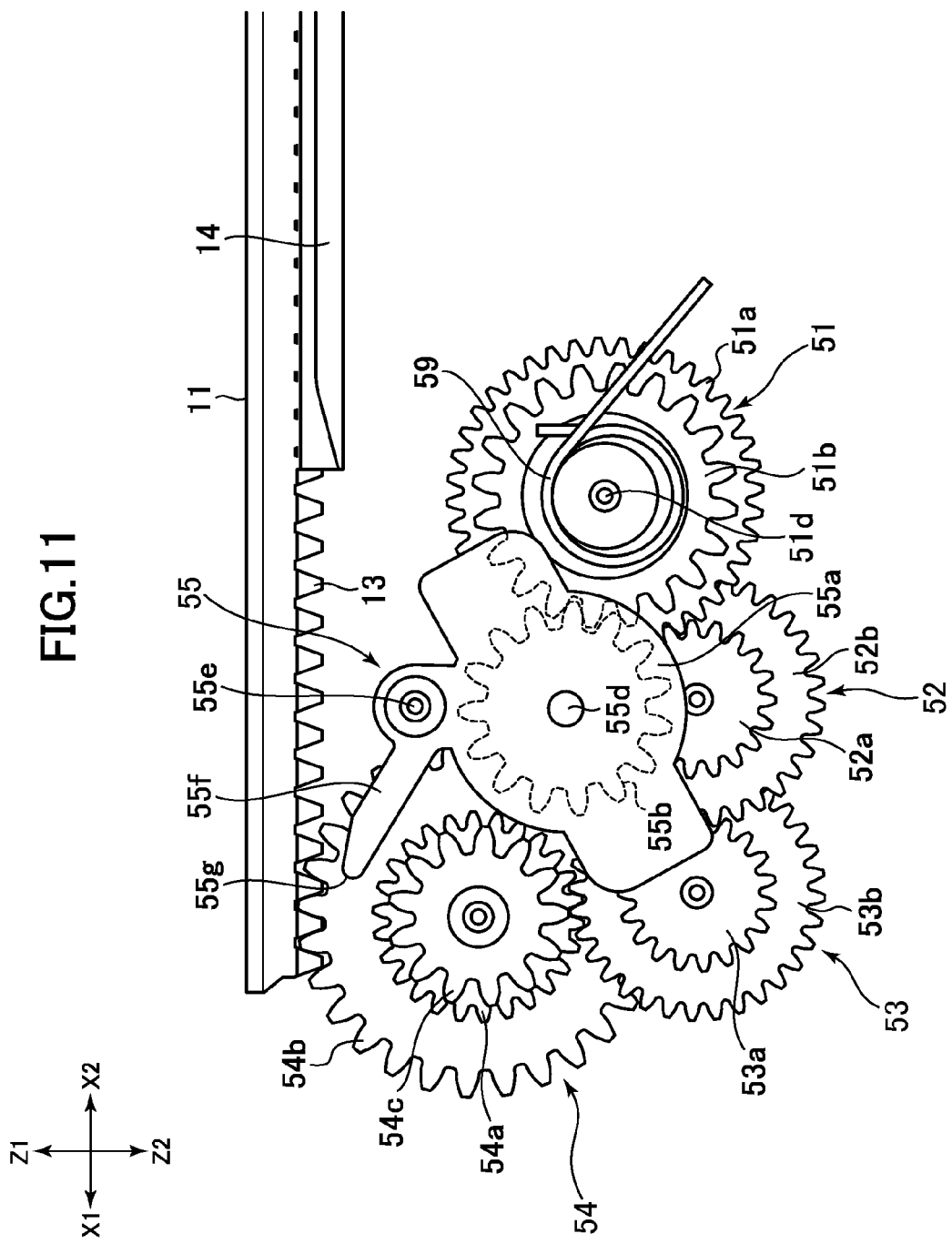
FIG. 11 is a front view of the drive mechanism, which shows the damper located at a position when the electronic device is horizontally arranged.
Figure 12:
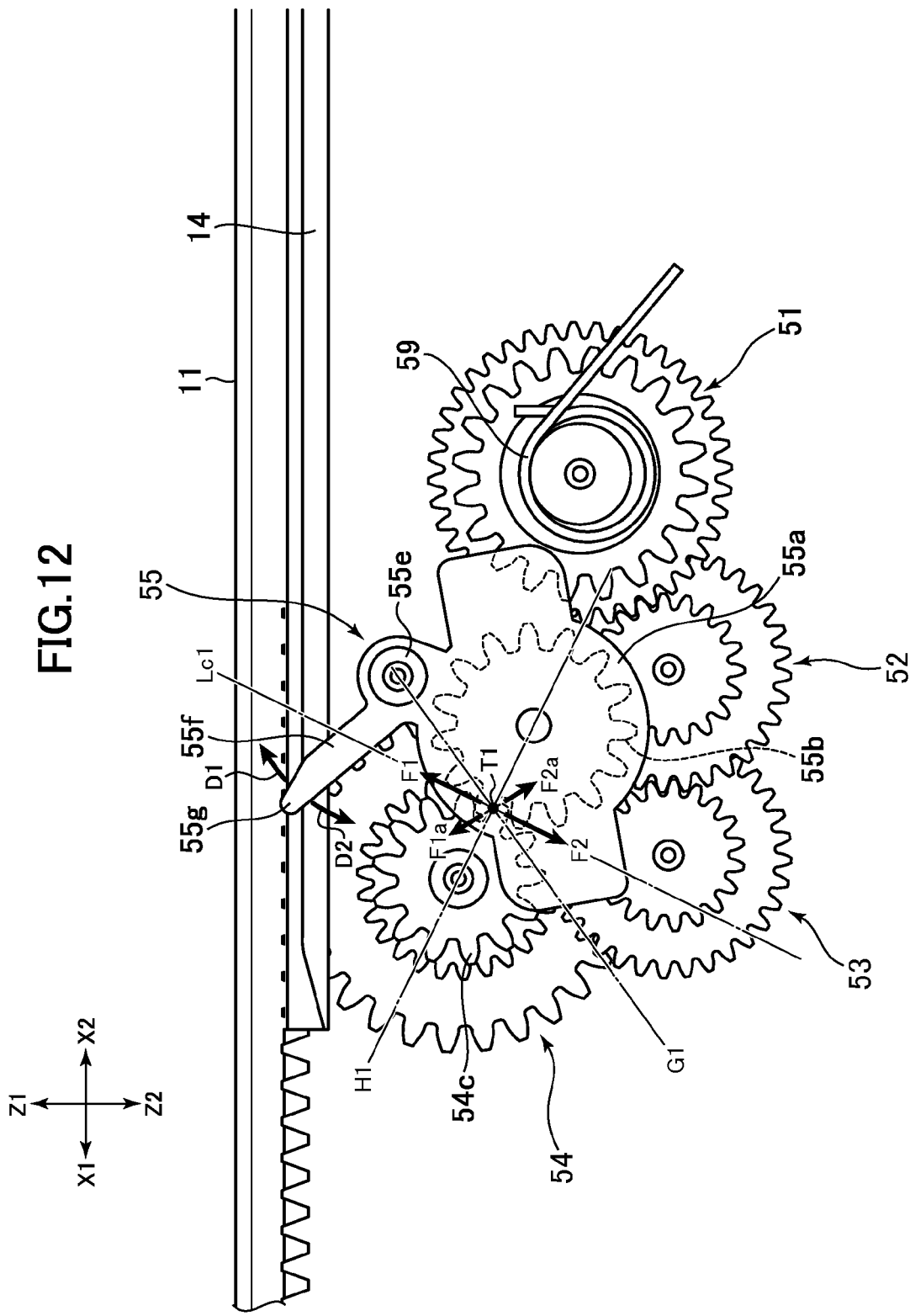
FIG. 12 is a front view of the drive mechanism, which shows an appearance of the slide cover moved in a state where the electronic device is vertically arranged.

The electronic device 1 can be vertically and horizontally located. In FIG. 1B described above, the electronic device 1 is horizontally located. In this example, when the electronic device 1 is arranged at the vertical posture, the disc arrangement region covered with the slide cover 11 is positioned on the upper portion of the electronic device 1. In this example, the electronic device 1 has the disc arrangement region on the right side portion, and therefore the left side surface is positioned on the lower side at the vertical posture. As will be described later, the drive mechanism G includes a damper 55. FIG. 10 illustrates the damper 55 in a state where the electronic device 1 is vertically located, and the slide cover 11 is placed at the closed position. FIG. 11 illustrates the damper 55 in a state where the electronic device 1 is horizontally located, and the slide cover 11 is placed at the closed position. FIG. 12 illustrates a state in which the electronic device 1 is vertically located, and the slide cover 11 is placed between the closed position and the open position. FIG. 13 illustrates a state in which the electronic device 1 is horizontally located, and the slide cover 11 is placed between the closed position and the open position. In FIGS. 10 and 12, X1 denotes the direction of the gravity force, and in FIGS. 11 and 13, Z2 denotes the direction of the gravity force.

As illustrated in FIG. 10, the drive mechanism G includes a drive gear 51. The spring 59 is attached to the drive gear 51. The spring 59 is a torsional spring which exerts an elastic force (rotating force) urging the slide cover 11 toward the open position. One end of the spring 59 is engaged with the drive gear 51, and the other end thereof catches on the above-mentioned holder 6. The spring 59 urges the drive gear 51 in a rotating direction (clockwise direction) thereof in a state where the slide cover 11 is placed at the closed position. A front edge of the slide cover 11 has a rack 13 formed thereon. The drive mechanism G includes a final gear 54 engaging with the rack 13. The final gear 54 urges the slide cover 11 toward the open position, while receiving a rotating force of the drive gear 51.

In this example, the drive mechanism G includes two idle gears 52 and 53. The rotating force of the drive gear 51 is transmitted to the final gear 54 through those two idle gears 52 and 53. In more detail, the rotating force of the drive gear 51 is transmitted to the final gear 54 as follows. As illustrated in FIG. 9, the idle gear 52 includes a first gear 52a and a second gear 52b which are coaxially arranged, and integrally rotated. In this example, the second gear 52b is larger in diameter than the first gear 52a. Also, the idle gear 53 includes a first gear 53a and a second gear 53b which are coaxially arranged, and integrally rotated. The second gear 53b is larger in diameter than the first gear 53a. The first gear 52a of the idle gear 52 is engaged with a first gear 51a of the drive gear 51, and the second gear 52b of the idle gear 52 is engaged with the first gear 53a of the idle gear 53. The final gear 54 includes a first gear 54a engaged with the second gear 53b of the idle gear 53, and a second gear 54b arranged coaxially with the first gear 54a, and rotated integrally with the first gear 54a. The second gear 54b is engaged with the rack 13 of the slide cover 11. The second gear 54b is larger in diameter than the first gear 54a. The drive mechanism G is arranged in the recess 20a formed in front of the upper housing 20 (refer to FIG. 8). Shafts 51d, 52d, 53d, and 54d supporting the gears 51 to 54, respectively, are supported by the front wall portion 21 formed in the upper housing 20, and the holder 6.

The number of teeth of the respective gears 51a, 52a, 52b, 53a, 53b, 54a, and 54b are designed so that a rotating speed of the final gear 54 is higher than a rotating speed of the drive gear 51. That is, the number of teeth of the respective gears 51a, 52a, 52b, 53a, 53b, 54a, and 54b are set so that a number of rotation of the final gear 54 when the slide cover 11 moves a unit distance is higher than a number of rotation of the drive gear 51 when the slide cover 11 moves the same distance.

The drive mechanism G further includes the damper 55. The damper 55 is formed of a rotary damper, and for example, includes a main body 55a into which oil is sealed, and a rotating member which rotates within the main body 55a. The damper 55 is not limited to have the above configuration. For example, the damper 55 may include a rotating member having a friction portion pushed against an inner surface of the main body 55a, within the main body 55a. The damper 55 exerts a resistance force corresponding to the rotating speed of the rotating member.

As described above, the final gear 54 is engaged with the rack 13 of the slide cover 11, and rotates due to the movement of the slide cover 11. The damper 55 is so supported as to move between two positions (hereinafter referred to as a first damper position and a second damper position). The first damper position is where the damper 55 is engaged with the final gear 54 to function as a resistance (load) against the rotation of the final gear 54 as illustrated in FIGS. 10 and 12. The second damper position is where the engagement between the damper 55 and the final gear 54 is released as illustrated in FIGS. 11 and 12. As illustrated in FIG. 9, the final gear 54 includes a third gear 54c in addition to the above-mentioned gears 54a and 54b. The damper 55 includes a gear 55b interlocked with the rotating member within the main body 55a of the damper 55. The gear 55b is engaged with the third gear 54c of the final gear 54. With the above configuration, the damper 55 functions as a resistance against the rotation of the final gear 54 at the first damper position. In this example, both of the gear 55b and the rotating member rotate around a shaft 55d.

As described above, there are cases in which the electronic device 1 is vertically located, and horizontally located. The damper 55 is so supported as to move between the first damper position and the second damper position when the posture of the electronic device 1 changes. More specifically, the damper 55 is arranged at the first damper position by its own weight (that is, by the gravity force in an X1 direction) in the vertical posture state. The damper 55 is arranged at the second damper position by its own weight (that is, by the gravity force in a Z2 direction) in the horizontal posture state. The damper 55 includes a shaft 55e positioned away from the shaft 55d in a radical direction of the shaft 55d. The main body 55a of the damper 55 is rotatably (swingably) supported by the shaft 55e, and moves between the first damper position and the second damper position (hereinafter, the shaft 55e is called "swing shaft"). The swing shaft 55e is positioned on an upper side of the shaft 55d when the electronic device 1 is horizontally located. Further, the swing shaft 55e is positioned higher than the shaft 55d when the electronic device 1 is vertically located. With the above layout of the swing shaft 55e, when the electronic device 1 is horizontally located, the damper 55 is arranged at the second damper position illustrated in FIG. 11 by its own weight. Also, when the electronic device 1 is vertically located, the damper 55 is arranged at the first damper position illustrated in FIG. 10 by its own weight. As a result, when the slide cover 11 is opened in the state where the electronic device 1 is vertically located, a moving speed of the slide cover 11 can be reduced, and the gentle opening of the slide cover 11 can be realized.

In this example, as illustrated in FIG. 11, the damper 55 is engaged with the drive gear 51 at the second damper position. In this example, the drive gear 51 includes a second gear 51b in addition to the first gear 51a. The gear 55b of the damper 55 is engaged with the second gear 51b at the second damper position.

The damper 55 exerts a resistance force corresponding to the rotating speed of the rotating member housed within the main body 55a, that is, the rotating speed of the gear 55b. As described above, the number of teeth of the respective gears 51a, 52a, 52b, 53a, 53b, 54a, and 54b are designed so that a number of rotation of the final gear 54 when the slide cover 11 moves a unit distance is higher than a number of rotation of the drive gear 51 when the slide cover 11 moves the same distance. In other words, the rotating speed of the drive gear 51 is smaller than the rotating speed of the final gear 54. According to this structure, in both of the case in which the electronic device 1 is vertically located and the case in which the electronic device 1 is horizontally located, the gentle opening of the slide cover 11 can be realized.

The final gear 54 is located at an end of a path through which the rotating force exerted by the spring 59 is transmitted to the slide cover 11. The drive gear 51 is located at a beginning of the path. This makes it easy to increase a difference between the number of rotation of the final gear 54 relative to the unit moving distance of the slide cover 11 and the number of rotation of the drive gear 51 relative to the unit moving distance.

The drive gear 51 and the final gear 54 are arranged away from each other in the right-left direction, and the gear 55b of the damper 55 is arranged between those gears 51 and 54. The drive gear 51 is spaced upward from the final gear 54 in the state where the electronic device 1 is vertically located. The drive gear 51 is positioned lower than the final gear 54 is, in the state where the electronic device 1 is horizontally located. The gear 55b is positioned between the drive gear 51 and the final gear 54, and the swing shaft 55e is positioned on the upper side of the gear 55b in the state where the electronic device 1 is horizontally located. With this layout of the gear 55b and the swing shaft 55e, the damper 55 rotates around the swing shaft 55e when the posture of the electronic device 1 changes, and is selectively engaged with the drive gear 51 and the final gear 54.

As illustrated in FIG. 12, when the final gear 54 rotates, forces F1 and F2 are exerted in directions corresponding to a direction along which the final gear 54 rotates, on the teeth (contact point T1 with the final gear 54) of the gear 55b which is engaged with the final gear 54. In this example, when the slide cover 11 moves from the closed position toward the open position, the final gear 54 rotates counterclockwise, and thus the gear 55b is subject to the force F1. On the contrary, when the slide cover 11 moves from the open position toward the closed position, the final gear 54 rotates clockwise, and thus the gear 55b is subject to the force F2 in a direction opposite to that of the force F1. The force F2 is exerted on the damper 55 as a force in a direction in which the gear 55b moves away from the final gear 54. That is, the force F2 includes a force component F2a in a direction perpendicular to a straight line G1 connecting the rotation center of the swing shaft 55e of the damper 55 and the contact point T1. The force component F2a rotates the damper 55 around the swing shaft 55e in a direction (in this example, a counterclockwise direction) in which the gear 55b moves away from the final gear 54. The force F1 includes a force component F1a in a direction perpendicular to the straight line G1. The force component F1a rotates the damper 55 around the swing shaft 55e in a direction (in this example, a clockwise direction) in which the gear 55b moves close to the final gear 54.

As illustrated in FIG. 12, the slide cover 11 includes a stopper portion 14. The stopper portion 14 is abutted against the damper 55 when the slide cover 11 is placed between the open position and the closed position, and restricts the movement of the damper 55 between the first damper position and the second damper position. That is, the stopper portion 14 suppresses the damper 55 from moving such that the gear 55b moves apart from the final gear 54 when the damper 55 is arranged at the first damper position. In this example, the stopper portion 14 is formed along the rack 13 on the front edge of the slide cover 11, and extends in the right-left direction (movement direction of the slide cover 11). The damper 55 includes a stopped arm 55f extending in a radial direction from the swing shaft 55e. In this example, the stopped arm 55f is extended upward, and inclined toward the final gear 54. The stopped arm 55f includes an engaged portion 55g bent toward the stopper portion 14 on an end thereof (refer to FIG. 8). When the slide cover 11 moves from the closed position to the open position, the stopper portion 14 goes into between a position of the engaged portion 55g when the damper 55 is arranged at the first damper position, and a position of the engaged portion 55g when the damper 55 is arranged at the second damper position. When the damper 55 is arranged at the first damper position illustrated in FIG. 12, the stopper portion 14 is positioned on the lower side of the engaged portion 55g. That is, the engaged portion 55g is arranged on an upper surface of the stopper portion 14. When the damper 55 receives the force F2 to rotate in a direction away from the final gear 54, that is, when the slide cover 11 moves from the open position to the closed position, the engaged portion 55g is abutted against the upper surface of the stopper portion 14 in a direction D2 illustrated in FIG. 12. As a result, the rotation of the damper 55 is restricted by the stopper portion 14. On contrary, when the damper 55 receives the force F1 to rotate in the direction toward the final gear 54, that is, when the slide cover 11 moves from the closed position to the open position, the force F1 causes a force (force in a direction D1 illustrated in FIG. 12) to move the engaged portion 55g away from the upper surface of the stopper portion 14. For that reason, the restriction of the rotation by the stopper portion 14 is ineffective.

The stopper portion 14 is so formed as not to be abutted against the damper 55 when the slide cover 11 is placed at the closed position. That is, as illustrated in FIGS. 8 and 10, a length L3 of the stopper portion 14 and a position of the stopper portion 14 are designed so that the engaged portion 55g of the stopped arm 55f does not interfere with the stopper portion 14 when the slide cover 11 is placed at the closed position. With the above configuration, the damper 55 is allowed to move between the first damper position and the second damper position when the slide cover 11 is placed at the closed position. When the slide cover 11 is placed between the closed position and the open position, the rotation to move the gear 55b away from the final gear 54, that is, the movement of the damper 55 toward the second damper position is restricted.

Also, the length L3 and the position of the stopper portion 14 are designed so that the stopped arm 55f does not interfere with the stopper portion 14 when the slide cover 11 is placed at the open position. With the above configuration, the damper 55 is allowed to move between the first damper position and the second damper position when the slide cover 11 is placed at the open position.

As described above, the final gear 54 rotates in the clockwise direction when the slide cover 11 moves from the open position toward the closed position. When the final gear 54 rotates in the clockwise direction, the damper 55 is subject to the force F2 in the direction in which the gear 55b moves away from the final gear 54. Thus, the force F2 is generated when the slide cover 11 moves from the open position to the closed position. More specifically, as illustrated in FIG. 12, the swing shaft 55e of the damper 55 is positioned toward the gear 55b from a common tangent Lc1 at the contact point T1 between the gear 55b and the final gear 54. Further, the swing shaft 55e is positioned at a side opposite to the direction of the force F2 from a line H1 passing through the rotation centers of the gear 55b and the final gear 54. With this layout of the swing shaft 55e, the force F2 is generated when the slide cover 11 moves from the open position to the closed position. When the operation member 5 is pushed, the slide cover 11 moves from the closed position to the open position upon receiving the rotating force of the spring 59. The arrangement of the damper 55 for generating the force F2 prevents the rotating force of the spring 59 from being reduced by a friction between the stopper portion 14 and the stopped arm 55f of the damper 55.

As illustrated in FIG. 13, when the damper 55 is arranged at the second damper position, the engaged portion 55g of the stopped arm 55f is positioned on a lower side of the stopper portion 14. That is, a rotation angle of the damper 55 between the first damper position and the second damper position is designed so that the engaged portion 55g of the stopped arm 55f moves between the upper side and the lower side of the stopper portion 14 of the slide cover 11. With this arrangement, as illustrated in FIG. 12, when the damper 55 is arranged at the first damper position, the engaged portion 55g is positioned on the upper side of the stopper portion 14. As illustrated in FIG. 13, when the damper 55 is arranged at the second damper position, the engaged portion 55g is positioned on the lower side of the stopper portion 14.

As illustrated in FIG. 13, when the drive gear 51 is rotated in a state where the damper 55 is arranged at the second damper position, forces F3 and F4 in directions corresponding to the rotating directions of the drive gear 51 are exerted on the teeth (a contact point T2 with the drive gear 51) of the gear 55b that is engaged with the drive gear 51. In this example, when the slide cover 11 moves from the closed position toward the open position, the drive gear 51 rotates clockwise, and the gear 55b is subject to the force F3. On the contrary, when the slide cover 11 moves from the open position to the closed position, the drive gear 51 rotates counterclockwise, and the gear 55b is subject to the force F4 in a direction opposite to that of the force F3. The force F4 is exerted on the damper 55 as a force in a direction in which the gear 55b moves away from the drive gear 51. That is, the force F4 includes a force component F4a in a direction perpendicular to a straight line G2 connecting the rotation center of the swing shaft 55e of the damper 55 and the contact point T2.

The force component F4a rotates the damper 55 around the swing shaft 55e in a direction (in this example, the clockwise direction) which the gear 55b moves away from the drive gear 51. When the damper 55 is arranged at the second damper position, the engaged portion 55g of the stopped arm 55f is positioned on the lower side of the stopper portion 14. For that reason, the force component F4a pushes the engaged portion 55g against the stopper portion 14 in a direction D4 illustrated in FIG. 13. As a result, the clockwise rotation of the damper 55 is restricted by the lower surface of the stopper portion 14. The force F3 includes a force component F3a in a direction perpendicular to the straight line G2. The force component F3a rotates the damper 55 around the swing shaft 55e in a direction in which the gear 55b moves toward the drive gear 51 (in this example, the counterclockwise direction). As a result, because the engaged portion 55g is to move in a direction D3 in FIG. 13, the restriction of the rotation by the stopper portion 14 is ineffective.

As described above, when the slide cover 11 moves from the open position toward the closed position in the state where the damper 55 is placed at the first damper position, the force component F2a to move the damper 55 away from the final gear 54 is exerted on the damper 55. Also, when the slide cover 11 moves from the open position toward the closed position in the state where the damper 55 is placed at the second damper position, the force component F4a to move the damper 55 away from the drive gear 51 is exerted on the damper 55. A direction in which the force component F4a acts on the damper 55, and a direction in which the force component F2a acts on the damper 55 are opposite to each other. Also, a position of the engaged portion 55g of the stopped arm 55f in the state where the damper 55 is arranged at the second damper position is opposite across the stopper portion 14 to a position of the engaged portion 55g in the state where the damper 55 is arranged at the first damper position. With the above structure, the rotation of the damper 55 by the force component F4a is restricted by one surface (lower surface in this example) of the stopper portion 14, and the rotation of the damper 55 by the force component F2a is restricted by the other surface (upper surface in this example) of the stopper portion 14. In this example, as described above, the force component F2a is to rotate the damper 55 in counterclockwise, and the rotation of the damper 55 by the force component F2a is restricted by the upper surface of the stopper portion 14. Also, the force component F4a is to rotate the damper 55 in clockwise, and the rotation of the damper 55 by the force component F4a is restricted by the lower surface of the stopper portion 14. In this embodiment, the rotating direction of the drive gear 51 and the rotating direction of the final gear 54 are designed so that the force component F4a and the force component F2a act to rotate the damper 55 in the directions opposite to each other. More specifically, the two idle gears 52 and 53 are arranged in the transmission path of the rotating force from the drive gear 51 to the final gear 54, and thus the rotating direction of the drive gear 51 and the rotating direction of the final gear 54 are opposite to each other. As a result, when the slide cover 11 moves from the open position toward the closed position, the final gear 54 rotates counterclockwise, the idle gear 53 rotates clockwise, and the idle gear 52 rotates counterclockwise. As a result, the drive gear 51 rotates clockwise.

As described above, the rotatable member 31 includes the stopper portion 32 which is abutted against the engaged portion 12 so as to restrict the relative movement of the engaged portion 12 of the slide cover 11 when the slide cover 11 is placed at the closed position. The stopper portion 32 is formed at a position away from the rotation center of the rotatable member 31. The rotatable member 31 rotates to allow the relative movement of the engaged portion 12 when the stopper portion 32 is pushed by the engaged portion 12. As a result, the angle between the stopper surface 32a formed on the stopper portion 32 and the movement direction (right-left direction) of the engaged portion 12 can be increased. As a result, the slide cover 11 can be stably held at the closed position. Also, the user can open the slide cover 11 as occasion demands.

The engaged portion 12 is relatively movable with respect to the rotatable member 31 in the right-left direction, and the rotatable member 31 is relatively movable away from the movement course of the engaged portion 12 in a direction (rearward in the above example) intersecting with the movement direction of the engaged portion 12. Also, the operation member 5 is so disposed as to move the rotatable member 31 rearward, and the spring 59 urges the slide cover 11 toward the open position. According to this configuration, the user can open the slide cover 11 by both of the operation of the operation member 5 and the manual operation.

The stopper portion 32 of the rotatable member 31 is movable from the first stopper position P1 to the second stopper position P2 when the rotatable member 31 rotates to allow the relative movement of the engaged portion 12. The first stopper position P1 and the second stopper position P2 are defined on the movement course of the engaged portion 12. The rotatable member 31 includes the plurality of stopper portions 32 in the peripheral direction around the rotation center of the rotatable member 31. Accounting to this configuration, both of the opening of the slide cover 11 by the operation of the operation member 5 and the closing of the slide cover 11 by the manual operation can be enabled, and the rotatable member 31 and the spring 7 work when the slide cover 11 is manually closed.

The engaged portion 12 is relatively movable in the right-left direction with respect to the rotatable member 31, and the stopper portion 32 of the rotatable member 31 is movable between the first stopper position P1 and the second stopper position P2 due to the rotation of the rotatable member 31. Both of the first stopper position P1 and the second stopper position P2 are defined on the movement course of the engaged portion 12. With the above configuration, the rotatable member 31 and the spring 7 can work even when the slide cover 11 is manually closed.

The spring 7 urges the rotatable member 31 in the direction (forward in the above example) perpendicular to both of the movement direction of the engaged portion 12 and the axis passing through the rotation center of the rotatable member 31. The operation member 5 includes the stopper pushing surface 5d (abutment surface) positioned forward from the rotatable member 31. The rotatable member 31 includes a pushed surface 31a which is pushed against the stopper pushing surface 5d when a stopper portion 32 (for example, the stopper portion 32-1 illustrated in FIGS. 6A, 6B, and 6C) is placed at the first stopper position P1, and the rotatable member 31 includes another pushed surface 31a which is pushed against the stopper pushing surface 5d when the same stopper portion 32 is placed at the second stopper position P2. According to this configuration, the rotatable member 31 can keep its position in both of the state in which a certain stopper portion 32 is placed at the first stopper position P1 and the state in which the stopper portion 32 is placed at the second stopper position P2.

The electronic device 1 includes the damper 55. The damper 55 is so supported as to move between the first damper position (FIG. 10) and the second damper position (FIG. 11) when the posture of the electronic device changes. The damper 55 at the first damper position is engaged with the final gear 54 to function as a resistance against the rotation of the final gear 54. The second damper position is where the engagement between the damper 55 and the final gear 54 is released According to this configuration, the gentle opening of the slide cover 11 can be realized without depending on the change in the posture of the electronic device.

The electronic device 1 includes the drive gear 51. The drive gear 51 is interlocked with the movement of the slide cover 11, and has a smaller amount of motion than that of the final gear 54 when the slide cover 11 moves a unit distance. The damper 55 is engaged with the drive gear 51 at the second damper position. According to this configuration, in both of the case in which the electronic device 1 is vertically located and the case in which the electronic device 1 is horizontally located, the opening of the slide cover 11 becomes gentle.

The final gear 54 and the drive gear 51 which are engaged with the damper 55 are configured to transmit the force of the spring 59 exerting the elastic force for moving the slide cover 11 to the slide cover 11. According to this configuration, the number of parts in the electronic device 1 can be reduced.

The damper 55 includes the gear 55b arranged between the final gear 54 and the drive gear 51. The gear 55b is engaged with the final gear 54 when the damper 55 is placed at the first damper position, and engaged with the drive gear 51 when the damper 55 is placed at the second damper position. The damper 55 is supported by the swing shaft 55e positioned away from the gear 55b so that the gear 55b moves between the final gear 54 and the drive gear 51. According to this configuration, a structure in which the movement of the damper 55 is enabled between the first damper position and the second damper position can be relatively simply realized.

The damper 55 includes the gear 55b to be engaged with the final gear 54. The damper 55 is supported by the swing shaft 55e positioned away from the gear 55b so as to move between the first damper position and the second damper position. The slide cover 11 includes the stopper portion 14. The stopper portion 14 is abutted against the damper 55 and prevents the damper 55 from rotating in a direction in which the gear 55b moves away from the final gear 54. The stopper portion 14 is so formed as not to be abutted against the damper 55 when the slide cover 11 is placed at the closed position. According to this configuration, the movement of the damper 55 is allowed when the slide cover 11 is placed at the closed position, and the engagement between the final gear 54 and the damper 55 is maintained when the slide cover 11 is placed on the way between the closed position and the open position.

The final gear 54 rotates counterclockwise due to the movement of the slide cover 11 from the closed position toward the open position. The damper 55 is so arranged as to be subject to a force in the direction away from the final gear 54 when the final gear 54 rotates counterclockwise. This configuration can prevent the elastic force of the spring 59 from being reduced when the slide cover 11 is opened.

Figure 14A:
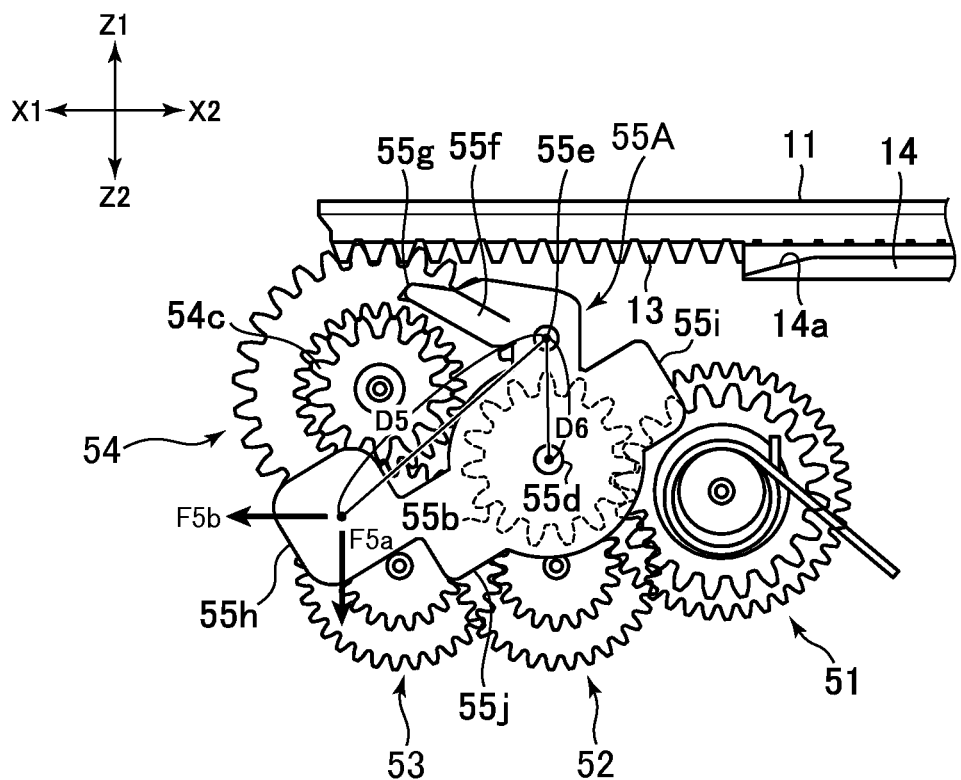
FIGS. 14A and 14B are diagrams illustrating a modified example of the damper.
Figure 14B:
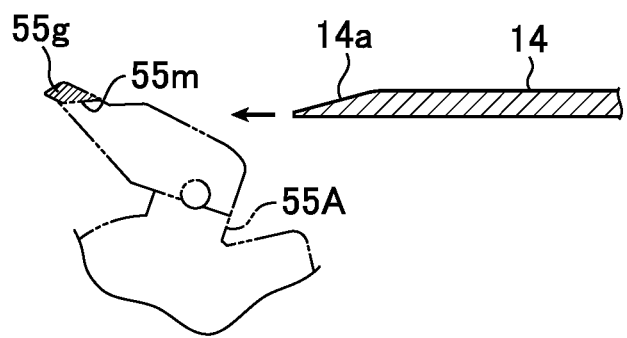

FIGS. 14A and 14B are diagrams illustrating a damper 55A which is a modified example of the damper 55. In FIGS. 14A and 14B, the same parts as those described above denote identical reference numerals or symbols. FIG. 14A illustrates a front view of the damper 55A and the drive gear 51. FIG. 14B is a cross-sectional view of the engaged portion 55g provided in the damper 55A, and the stopper portion 14.

As illustrated in FIG. 14A, the damper 55A has a weight portion 55h at a position away from the swing shaft 55e that swingably supports the damper 55A. The weight portion 55h moves the damper 55A toward the final gear 54 and the drive gear 51 by its own weight. That is, when the damper 55A is placed at the first damper position, that is, when the electronic device 1 is vertically located, a force F5*b* is exerted on the damper 55A by the weight of the weight portion 55*h*. The force F5*b* can make the damper 55A become toward the final gear 54. Also, when the damper 55A is placed at the second damper position, that is, when the electronic device 1 is laterally located, a force F5*a* is exerted on the damper 55A by the weight of the weight portion 55*h*. The force F5*a* makes the damper 55A become close to the drive gear 51. The weight portion 55*h* can prevent the damper 55A from moving away from the drive gear 51 or the final gear 54 when the movement of the damper 55A is not restricted by the stopper portion 14, more specifically, when the slide cover 11 is placed at the closed position.

The weight portion 55*h* is formed such that the position of the gravity center of the damper 55A is distanced from the swing shaft 55*e*. More specifically, as illustrated in FIG. 14A, the distance D5 from the swing shaft 55*e* to the gravity center of the weight portion 55*h* is larger than the distance D6 from the swing shaft 55*e* to the shaft 55*d* which is the rotation center of the rotating member (specifically, the gear 55*b*) of the damper 55A. Also, in this example, the weight portion 55*h* is positioned lower than the swing shaft 55*e* as with the shaft 55*d*.

The damper 55A includes protrusions 55*i* and 55*j* positioned at both sides of the shaft 55*d*. As illustrated in FIG. 14A, the weight portion 55*h* is formed on an end of one protrusion 55*j*. The position of the gravity center of the damper 55A is displaced toward the one protrusion 55*j* due to the weight portion 55*h*. In this example, the weight portion 55*h* is projected from the end of the protrusion 55*j* protruded toward a position lower than that of the final gear 54. More specifically, the weight portion 55*h* is projected from an upper portion of the end of the protrusion 55*j*. The weight portion 55*h* may be made of the same material as that of the other parts of the damper 55A, or a material different therefrom. Also, in order to increase the weight of the weight portion 55*h*, another member (for example, screw) made of metal may be attached to the weight portion 55*h*.

A moment exerted on the damper 55A can be increased when the electronic device 1 is horizontally located, that is, when the damper 55A is placed at the second damper position as illustrated in FIG. 14A by forming the weight portion 55*h* on the upper portion of the end of the protrusion 55*j*. As a result, to distance the damper 55A from the drive gear 51 can be more effectively suppressed. For example, when the slide cover 11 is again moved toward the open position immediately after the slide cover 11 is moved to the closed position in the state where the electronic device 1 is horizontally located, the damper 55A moves away from the drive gear 51 due to the force component F4*a* illustrated in FIG. 13, and the engaged portion 55*g* of the damper 55A may run on an upper surface of the stopper portion 14. The weight portion 55*h* enables this movement of the damper 55A to be suppressed.

As illustrated in FIG. 14B, the stopper portion 14 includes a guide surface 14*a* on an upper surface of the end thereof. The guide surface 14*a* is so inclined as to guide the engaged portion 55*g* of the damper 55A to an upper surface of the stopper portion 14. More specifically, the guide surface 14*a* is so inclined as to descend toward the end of the stopper portion 14. In particular, in this example, a height of the guide surface 14*a* is designed so that the damper 55A is guided to the upper surface of the stopper portion 14 even if the damper 55A is arranged at an intermediate position between the first damper position and the second damper position. For that reason, in the state where the electronic device 1 is vertically located, the damper 55A is more surely arranged at the first damper position.

Also, a guided surface 55*m* is formed on a lower surface of the engaged portion 55*g* of the damper 55A. The guided surface 55*m* is so inclined as to ascend toward the stopper portion 14. For that reason, in the state where the electronic device 1 is vertically located, the damper 55A easily runs on the stopper portion 14, and is more surely arranged at the first damper position.

Figure 15:
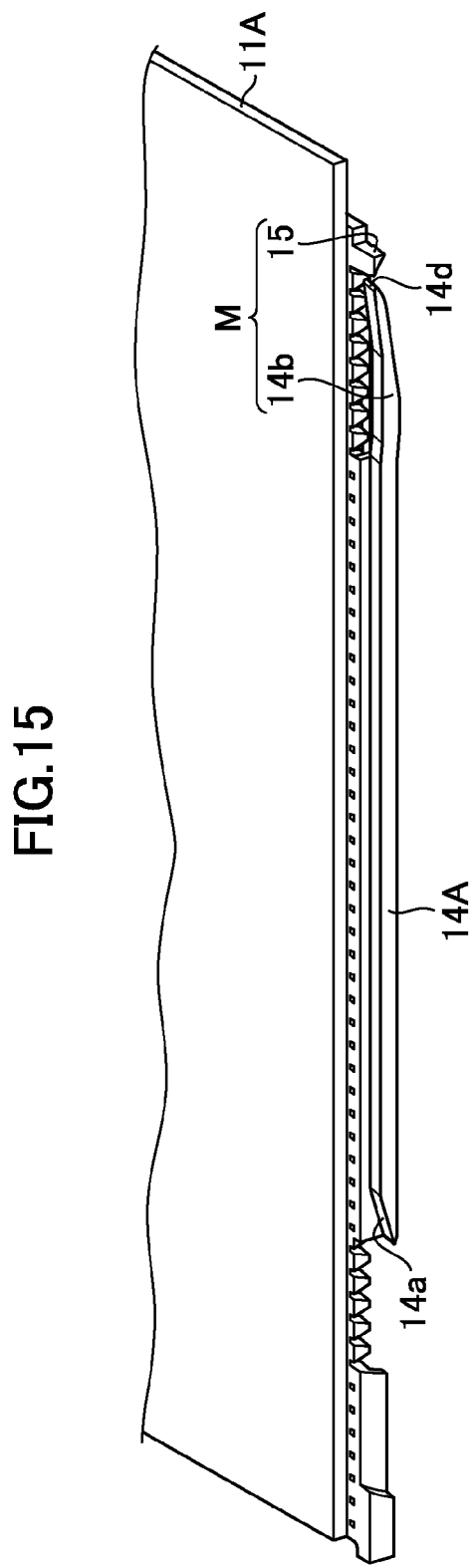
FIG. 15 is a diagram illustrating a modified example of the slide cover which includes a guide mechanism.
Figure 16A:
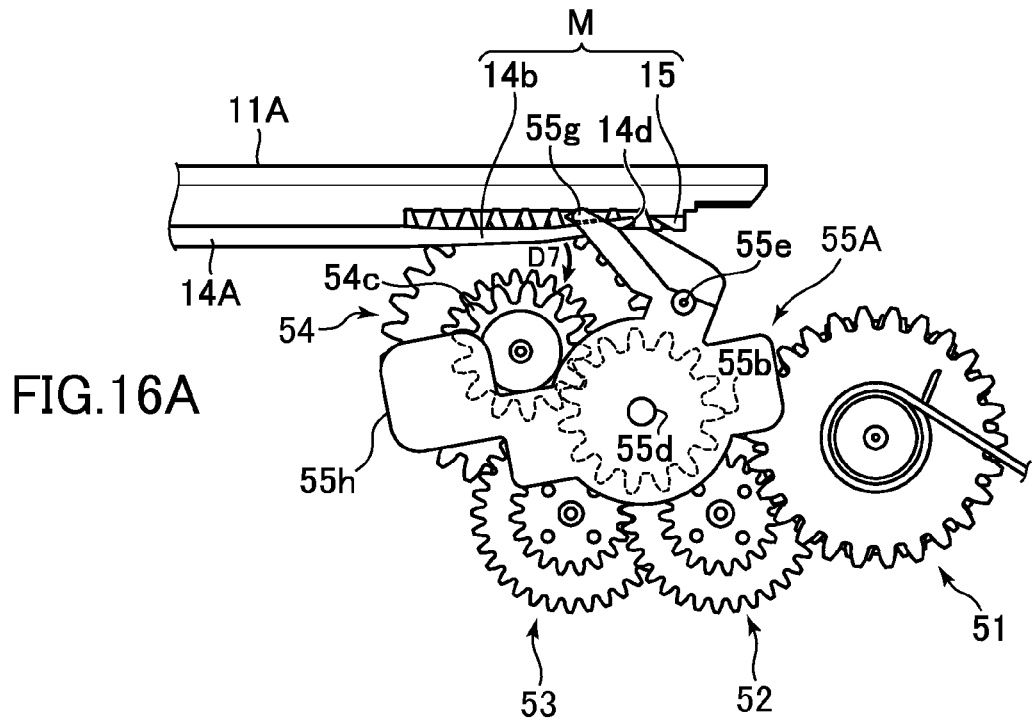
FIGS. 16A, 16B and 16C are diagrams illustrating the operation of the guide mechanism, which shows the damper and the guide mechanism immediately before the slide cover reaches the open position.
Figure 16B:
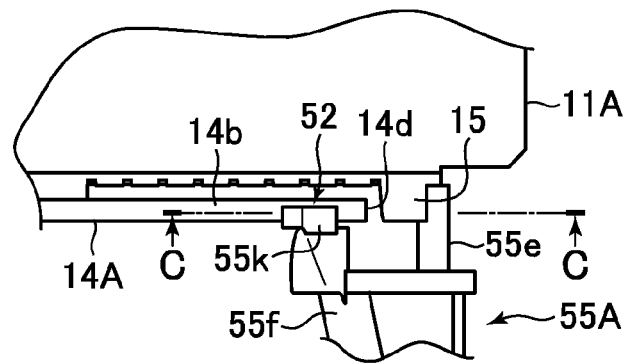
Figure 16C:
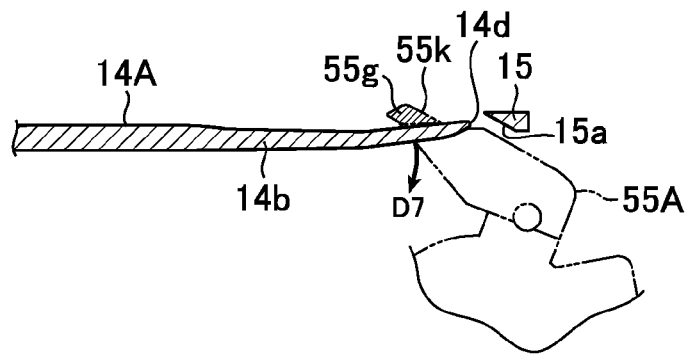
Figure 17A:
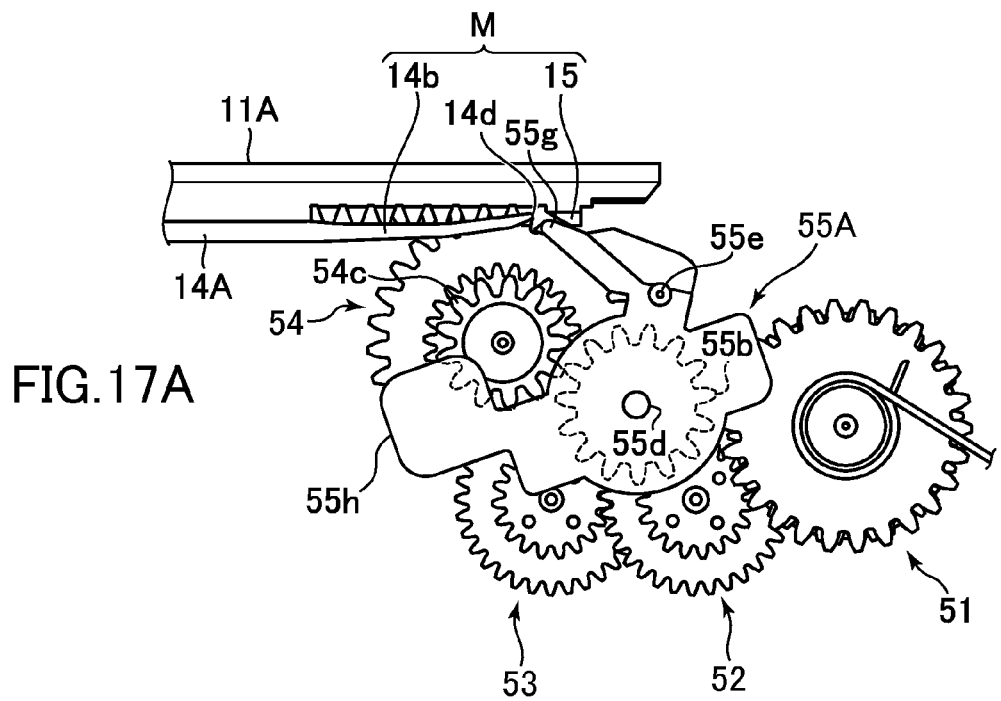
FIGS. 17A, 17B and 17C are diagrams illustrating the operation of the guide mechanism, which shows the damper and the guide mechanism in a state where the slide cover is arranged at the open position.
Figure 17B:
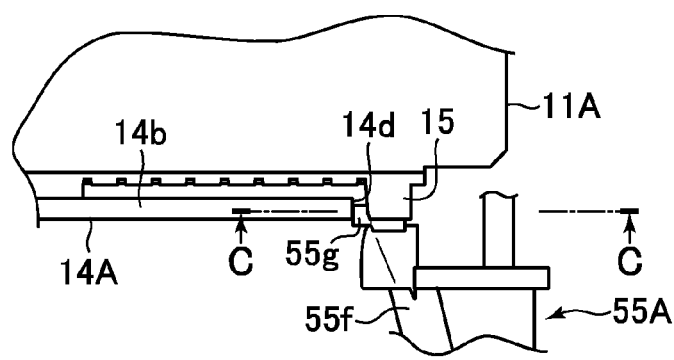
Figure 17C:
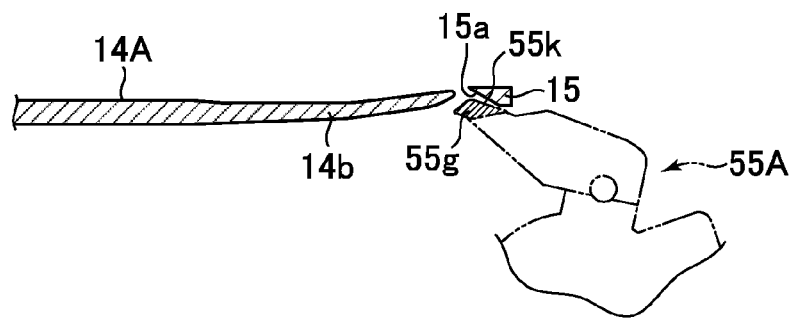

FIG. 15 is a diagram illustrating a slide cover 11A which is a modified example of the slide cover 11. The slide cover 11A includes a guide mechanism M. FIGS. 16A to 16C, and 17A to 17C are diagrams illustrating the operation of the guide mechanism M. Those figures illustrate the slide cover 11A and the above-mentioned damper 55A. FIGS. 16A to 16C illustrate the damper 55A and the guide mechanism M immediately before the slide cover 11A reaches the open position. FIGS. 17A, 17B, and 17C illustrate the damper 55A and the guide mechanism M in the state where the slide cover 11A is arranged at the open position. FIGS. 16A and 17A are front views thereof, FIGS. 16B and 17B are plan views thereof, and FIGS. 16C and 17C are cross-sectional views taken along a line c-c illustrated in FIGS. 16B and 17B. In those drawings, the same parts as those described above are denoted by identical reference numerals or symbols.

The guide mechanism M is configured so that the damper 55A is guided from the first damper position to the second damper position against the gravity force when the damper 55A is arranged at the first damper position (that is, the electronic device 1 is vertically located) and the slide cover 11A is placed at the open position. More specifically, the guide mechanism M is configured to guide the engaged portion 55*g* of the damper 55A from a first stopped position (upper surface of a stopper portion 14A in this example) to a second stopped position (lower surface of the stopper portion 14A in this example). The first stopped position is a position at which the engaged portion 55*g* is positioned when the damper 55A is arranged at the first damper position. The second stopped position is a position at which the engaged portion 55*g* is positioned when the damper 55A is arranged at the second damper position. With the guide mechanism M, when the slide cover 11A moves from the open position to the closed position, the damper 55A is arranged at the second damper position. As described above, the performance of the damper 55A is largely exerted at the first damper position as compared with the second damper position. For that reason, when the damper 55A is arranged at the second damper position, a user can close the slide cover 11A with a relatively small force.

As illustrated in FIG. 15, the slide cover 11A includes the stopper portion 14A extending in the movement direction of the slide cover 11A. The stopper portion 14A includes an elastic arm 14*b* at a portion against which the engaged portion 55*g* is abutted when the slide cover 11A is placed at a position close to the open position. The elastic arm 14*b* configures the guide mechanism M. The elastic arm 14*b* is pushed by the engaged portion 55*g* arranged at the first stopped position, and elastically deformed toward the second stopped position. In this example, the upper surface of the elastic arm 14*b* is so inclined as to ascend toward an end 14*d* of the stopper portion 14A. Also, the elastic arm 14*b* is elastically deformable downward. For that reason, when the engaged portion 55*g* of the damper 55A is arranged on the upper surface of the stopper portion 14A, that is, when the damper 55A is arranged at the first damper position, the elastic arm 14*b* is pushed down toward the second stopped position by the engaged portion 55*g*. That is, the elastic arm 14*b* is elastically deformed in a direction of D7 illustrated in FIGS. 16A and 16C.

Also, a lower surface of the elastic arm 14*b* is so inclined as to move up toward the end 14*d* of the stopper portion 14A. For that reason, when the slide cover 11A reaches the open position, and the engaged portion 55*g* exceeds the position of the end 14*d* of the stopper portion 14A, the elastic arm 14*b*, which has been pushed down by the engaged portion 55*g* up to then, is returned upward, and then the engaged portion 55*g* becomes positioned on the lower side of the elastic arm 14*b* (refer to FIGS. 17A and 17C). As a result, as illustrated in FIG. 17A, the damper 55A moves away from the first damper position. That is, the gear 55*b* of the damper 55A moves away from the gear 54*c* of the final gear 54. Then, when the slide cover 11A starts the movement from the open position to the closed position, the engaged portion 55*g* is positioned on the lower side of the elastic arm 14*b*. That is, the engaged portion 55*g* is positioned at the second stopped position, and the damper 55A is arranged at the second damper position.

As illustrated in FIG. 15, in this example, the guide mechanism M further includes a guide 15. The guide 15 is positioned in an extension direction of the stopper portion 14A from the stopper portion 14A. That is, the guide 15 is positioned in the movement direction of the slide cover 11A from the stopper portion 14A. As illustrated in FIG. 17C, the guide 15 includes a guide surface 15*a* that is abutted against the engaged portion 55*g* that exceeds the end 14*d* of the stopper portion 14A. The guide surface 15*a* is so inclined as to guide the engaged portion 55*g* at the first stopped position to the second stopped position. That is, the guide surface 15*a* is so inclined as to guide the engaged portion 55*g* to the lower side of the elastic arm 14*b*. In this example, the guide surface 15*a* is so inclined as to descend from the end nearer the elastic arm 14*b* toward an opposite end thereof. When the slide cover 11A reaches the open position, and the engaged portion 55*g* exceeds the end 14*d* of the stopper portion 14A, and then is abutted against the guide surface 15*a*, the engaged portion 55*g* can be surely guided to the lower side of the elastic arm 14*b* by the guide surface 15*a*.

As illustrated in FIG. 16C, the engaged portion 55*g* includes a guided surface 55*k* on an upper surface thereof. The guided surface 55*k* is so inclined as to descend toward an end nearer the guide 15. As a result, the engaged portion 55*g* can be more smoothly guided by the guide surface 15*a*.

The guide mechanism M illustrated in FIGS. 15 to 17C is configured by the elastic arm 14*b* and the guide 15. However, the guide mechanism M may not always include both of the elastic arm 14*b* and the guide 15. For example, even when the elastic arm 14*b* is not provided, the guide surface 15*a* of the guide 15 can be curved to the lower side of the stopper portion 14A so as to guide the engaged portion 55*g* toward the lower surface of the stopper portion 14A. Also, even when the guide 15 is not provided, the amount of downward elastic deformation of the elastic arm 14*b* can be increased to guide the engaged portion 55*g* to the lower side of the elastic arm 14*b*.

The present invention is not limited to the embodiments described above, but can be variously modified.

For example, the rotatable member 31 may be provided on the slide cover 11, and the engaged portion 12 may be formed on the upper housing 20. In this case, the operation member 5 may move the engaged portion 12 relative to the rotatable member 31.

Also, the dampers 55 and 55A may be engaged directly with the rack 13 formed on the slide cover 11. Also, the damper 55 may be engaged with other gears, the idle gears 52 and 53 instead of the final gear 54. Also, the damper 55 may not always be engaged with the drive gear 51.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An electronic device, comprising:
   a cover movable between an open position and a closed position;
   a movable portion which moves due to the movement of the cover; and
   a damper member that is supported so as to move between a first position and a second position when the posture of the electronic device changes, wherein the first position is where the damper member is engaged with the movable portion to function as a resistance against the movement of the movable portion, wherein the second position is where the engagement between the damper member and the movable portion is released.

2. The electronic device according to claim 1,
   wherein the damper member includes a gear engaged with the movable portion, and the damper member is supported by a shaft positioned away from the gear so as to move between the first position and the second position.

3. The electronic device according to claim 1, further comprising:
   a first movable portion employed as the movable portion; and
   a second movable portion which moves due to the movement of the cover, and has a smaller amount of motion than that of the first movable portion when the cover moves a unit distance,
   wherein the damper member is engaged with the second movable portion when being placed at the second position.

4. The electronic device according to claim 3, further comprising:
   a first gear employed as the first movable portion, and
   a second gear employed as the second movable portion, where the second gear has a smaller amount of rotation than that of the first gear when the cover moves the unit distance.

5. The electronic device according to claim 4, further comprising an elastic member applying an elastic force to move the cover between the closed position and he open position,
   wherein at least one of the first gear and the second gear is employed as a gear for transmitting the elastic force of the elastic member to the cover.

6. The electronic device according to claim 1, further comprising a stopper portion which restricts the movement of the damper member when the cover is located on the way between the open position and the closed position.

7. The electronic device according to claim 6, wherein
   the damper member includes a engaged portion,
   the stopper portion is formed on the cover, and
   the stopper portion goes into between a third portion and a fourth position when the cover moves from the closed position to the open position, wherein the third portion is defined as a position at which the engaged portion is located when the damper member is arranged at the first position, and the fourth position is defined as a position at which the engaged portion is located when the damper member is arranged at the second position.

8. The electronic device according to claim 6, further comprising a gear employed as the movable portion, wherein the damper member is applied from the gear with a force in a direction away from the gear when the cover moves from the closed position to the open position.

9. The electronic device according to claim 2, wherein the damper member includes a weight portion at a position away from the shaft, and
   the weight portion makes the damper member become close to the movable portion by its own weight.

10. The electronic device according to claim 6, further comprising a guide mechanism which guides the damper member from the first position to the second position when the cover is at the open position, not depending on the posture of the electronic device.

11. The electronic device according to claim 1, wherein the electronic device is in a vertical posture and in the first position and in a horizontal posture in the second position.

* * * * *